United States Patent
Ma et al.

(10) Patent No.: US 11,751,410 B2
(45) Date of Patent: Sep. 5, 2023

(54) ORGANIC PIGMENT COATING FOR ELECTRONIC DEVICES, PEROVSKITE SOLAR CELLS, AND METHODS

(71) Applicant: The Florida State University Research Foundation, Inc., Tallahassee, FL (US)

(72) Inventors: Biwu Ma, Tallahassee, FL (US); Qingquan He, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 42 days.

(21) Appl. No.: 17/189,662

(22) Filed: Mar. 2, 2021

(65) Prior Publication Data

US 2022/0285642 A1 Sep. 8, 2022

(51) Int. Cl.
- *B05D 1/00* (2006.01)
- *H10K 30/88* (2023.01)
- *H10K 30/10* (2023.01)

(52) U.S. Cl.
CPC ............. *H10K 30/88* (2023.02); *B05D 1/005* (2013.01); *H10K 30/10* (2023.02)

(58) Field of Classification Search
CPC ....................................................... B05D 1/005
See application file for complete search history.

(56) References Cited

PUBLICATIONS

He, Highly Efficient and Stable Perovskite Solar Cells Enabled by Low-Cost Industrial Organic Pigment Coating, Angew. Chem. Int. Ed., 2020, 60, p. 2485-2492 and Supporting Information p. 1-13 (Year: 2020).*
Chen, Quinacridone-Based Molecular Donors of Solution Processed Bulk-Heterojunction Organic Solar Cells, Applied Materials and Interfaces, vol. 2 No. 9, 2010, p. 2679-2686 (Year: 2010).*
E.D. Glowacki et al., "Hydrogen-Bonded Semiconducting Pigments for Air-Stable Field-Effect Transistors," Adv. Water. (2013), 25, pp. 1563-1569.
B. Scherwitzl et al., "Absorption, desorption, and film formation of quinacridone and its thermal cracking product indigo on clean and carbon-covered silicon dioxide surfaces," J. Chem. Phys. (2016), 145, 094702 (9 pages).
Y. Zou et al., "Synthesis and Solution Processing of a Hydrogen-Bonded Ladder Polymer," Chem (2017) 2, pp. 139-152.
D. H. Apaydin et al., "Direct Electrochemical Capture and Release of Cabon Dioxide Using an Industrial Orgnaic Pigment: Quinacridone," Angew. Chem. Int. Ed. (2014) 53, pp. 6819-6822.
J. Zhao et al., "Pi-Extended Diindole-Fused Azapentacenone: Synthesis, Characterization, and Photophysical and Lithium-Storage Properties," Chem. Asian J. (2016), 11, pp. 1382-1387.
R. Wang et al., "Constructive molecular configurations for surface-defect passivation of perovskite photovoltaics," Science (2019), 366, pp. 1509-1513.

* cited by examiner

*Primary Examiner* — Tabatha L Penny
(74) *Attorney, Agent, or Firm* — Eversheds Sutherland (US) LLP

(57) ABSTRACT

Methods of passivating a surface. The methods may include providing a mixture including a liquid and a derivative of quinacridone, applying the mixture to a first surface of a film that includes a metal halide perovskite, and annealing the film for a time and a temperature effective to convert the derivative of quinacridone to quinacridone. Composite materials and electronic devices also are provided.

8 Claims, 11 Drawing Sheets

US 11,751,410 B2

ORGANIC PIGMENT COATING FOR ELECTRONIC DEVICES, PEROVSKITE SOLAR CELLS, AND METHODS

STATEMENT REGARDING FEDERALLY SPONSORED RESEARCH OR DEVELOPMENT

This invention was made with government support under Contract No. FA9550-18-1-0231 awarded by the Air Force Office of Scientific Research, and Contract No. 1709116 awarded by the National Science Foundation. The government has certain rights in this invention.

BACKGROUND

Perovskite solar cells (PSCs) have benefited from materials development and device engineering. During the last decade, power conversion efficiencies (PCEs) have improved from around 4% to more than 25% for single junction devices.

However, long-term stability is one of the challenges that hinders the large scale commercialization of PSCs. Many approaches have been developed for improving the stability of PSCs, including surface passivation of halide perovskite thin films using various types of materials, such as organic halide salts, polymers, organic small molecules, low-dimensional perovskite hybrids, and inorganic compounds.

The function of surface passivation is twofold. The first is in suppressing charge recombination at the interfaces between perovskite and charge transport layers. The second is in increasing device stability by preventing the penetration of degrading agents (i.e., $H_2O$ and $O_2$) into the perovskite layer. While various types of materials have been developed as surface passivation agents, the long-term stability requirements for the commercialization of PSCs has not been met by these materials.

Industrial organic pigments typically are insoluble organic compounds of high sunshine-resistant coloring strength. Industrial organic pigments usually have very low solubilities in water.

There remains a need for improved passivation agents, including passivation agents that are easy to process, low cost, stable, or a combination thereof. There also remains a need for improved methods for surface passivation.

BRIEF SUMMARY

Provided herein are composite materials, electronic devices, and methods of passivating a surface, such as a surface of a metal halide perovskite, that may be at least partially coated (e.g., passivated) with quinacridone. In some embodiments, surface passivation of halide perovskite thin films with quinacridone is achieved via a facile spin-coating-annealing process, which, as described herein, may result in highly efficient and/or stable perovskite-based solar cells.

In one aspect, methods of passivating surfaces are provided. In some embodiments, the methods include providing a mixture that includes a liquid and a derivative of quinacridone, wherein the derivative of quinacridone is at least partially dissolved in the liquid; applying the mixture to a first surface of a film, wherein the film includes a metal halide perovskite; and annealing the film for a time and a temperature effective to convert the derivative of quinacridone to quinacridone.

In another aspect, composite materials are provided. In some embodiments, the composite materials include a film that includes a metal halide perovskite, the film having a first side and a second side opposite the first side; and a coating that includes quinacridone, wherein the coating at least partially coats the first side of the film.

In a still further aspect, electronic devices are provided. In some embodiments, the electronic devices include an electrode, a composite material as described herein; and a counter electrode, wherein the composite material is arranged between the electrode and the counter electrode. In some embodiments, the electronic devices also include a charge transport layer arranged between the composite material and the counter electrode. The electrode may contact the second side of the composite material, and the charge transport layer may contact the counter electrode and the coating including quinacridone. The electronic devices may include solar cells.

Additional aspects will be set forth in part in the description which follows, and in part will be obvious from the description, or may be learned by practice of the aspects described herein. The advantages described herein may be realized and attained by means of the elements and combinations particularly pointed out in the appended claims. It is to be understood that both the foregoing general description and the following detailed description are exemplary and explanatory only and are not restrictive.

Ag/Spiro-OMeTAD/Perovskite/ITO) based on embodiments of pristine and quinacridone passivated perovskite thin films.

Figure 16:
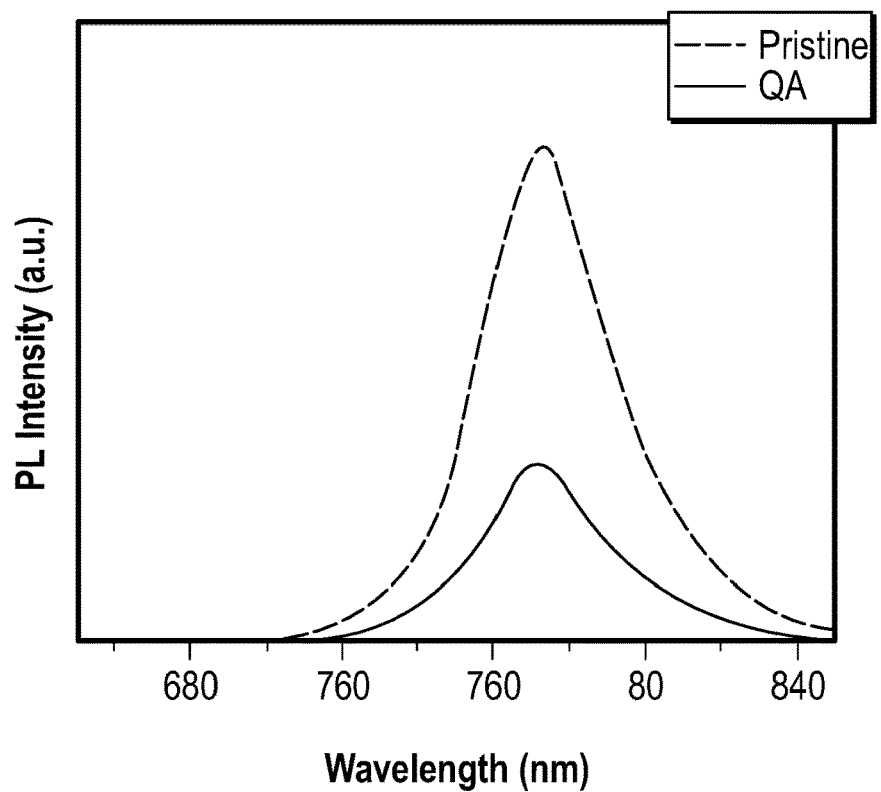

FIG. 16 depicts photoluminescence (PL) spectra of embodiments of perovskite/spiro-OMeTAD samples with and without quinacridone passivation.

Figure 17:
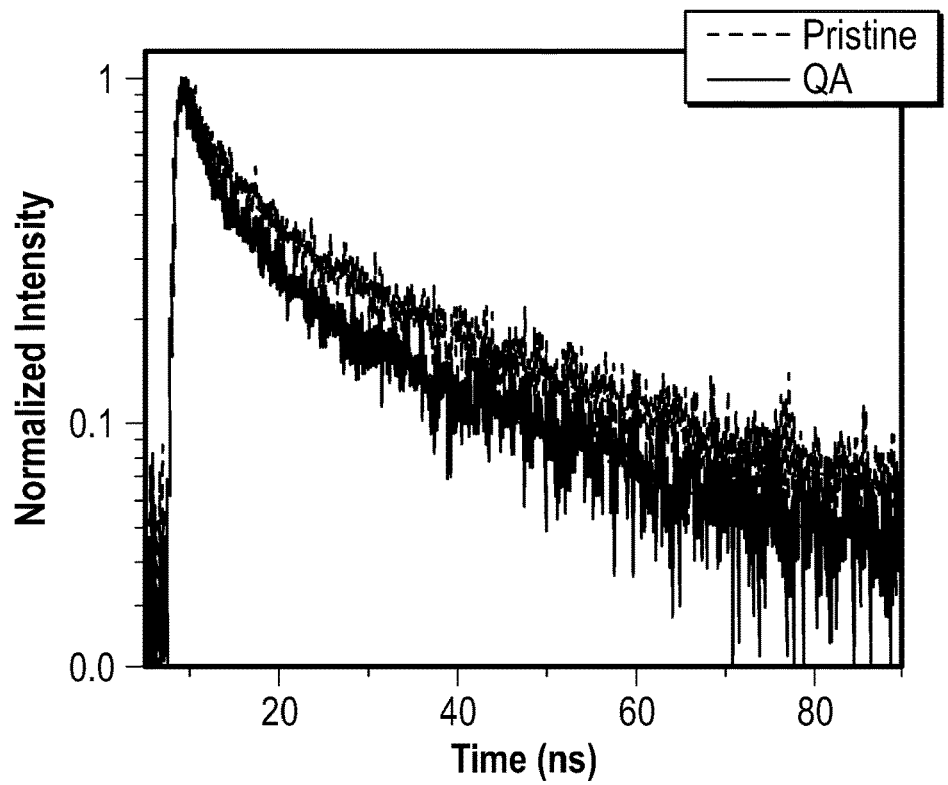

FIG. 17 depicts time-resolved PL decays of embodiments of perovskite/spiro-OMeTAD samples with and without quinacridone passivation.

Figure 18:
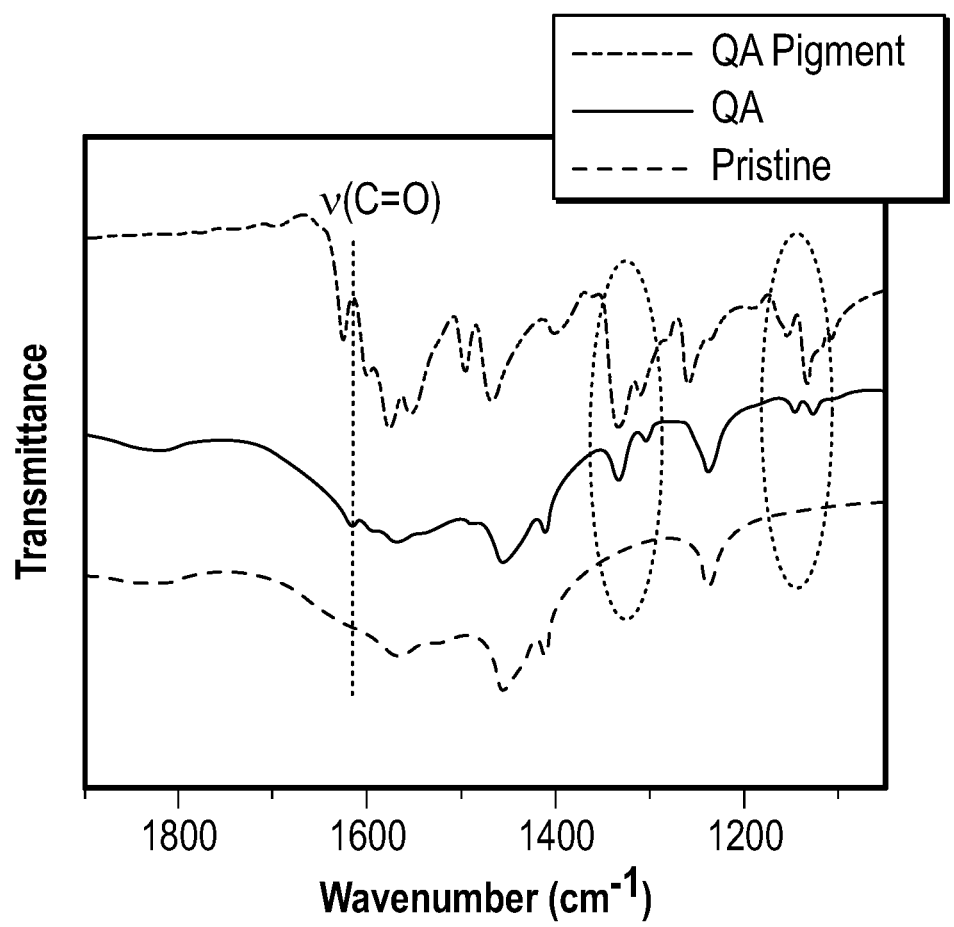

FIG. 18 depicts Fourier transform infrared (FTIR) spectra of embodiments of quinacridone pigment, pristine, and quinacridone passivated perovskites.

DETAILED DESCRIPTION

Provided herein are composite materials, electronic devices, and methods of passivating surfaces. In some embodiments, the methods described herein include a passivation strategy that uses a relatively low-cost industrial organic pigment, i.e., quinacridone, as a multifunctional passivation agent for halide perovskite thin films in order to achieve highly efficient and/or stable PSCs.

Methods of Passivating Surfaces

In some embodiments, the methods of passivating surfaces include providing a mixture that includes a liquid and a derivative of quinacridone.

The derivative of quinacridone may be at least partially dissolved in the liquid. In some embodiments, the derivative of quinacridone is completely dissolved in the liquid.

As used herein, the term "quinacridone" refers to 5,12-dihydro-quino[2,3-b]acridine-7,14-dione, which has the following structure:

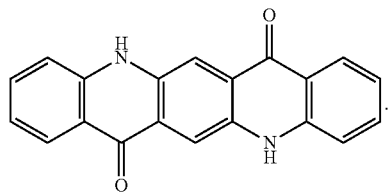 [SMILES: O=c1c2ccccc2[nH]c2cc3c(=O)c4ccccc4[nH]c3cc12]

As used herein, the phrase "derivative of quinacridone" refers to a compound that (i) has a greater solubility in the liquid than quinacridone, and (ii) is obtained by modifying the structure of quinacridone in order to increase the solubility of the resulting derivative of quinacridone in the liquid. The structure of quinacridone may be modified by substituting quinacridone with one or more polar groups or non-polar groups if the liquid is a polar liquid or non-polar liquid, respectively.

In some embodiments, the derivative of quinacridone is a compound of the following formula:

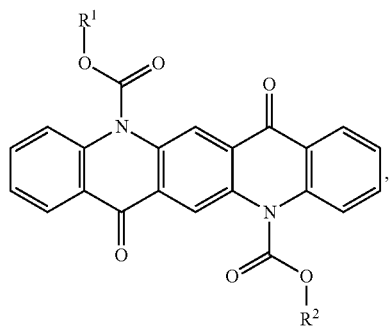

wherein $R^1$ and $R^2$ are independently selected from a $C_1$-$C_5$ hydrocarbyl.

In some embodiments, the derivative of quinacridone is di-tert-butyl-7,14-dioxo-7,14-dihydroquinolino[2,3-b]acridine-5,12-dicarboxylate:

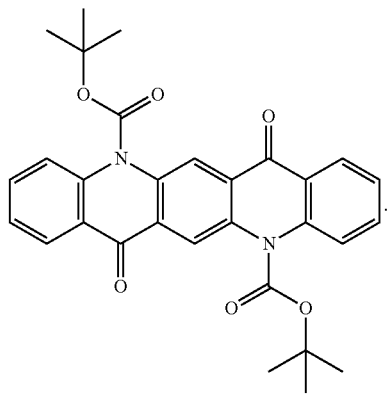 [SMILES: CC(C)(C)OC(=O)n1c2ccccc2c(=O)c2cc3c(cc21)c(=O)c1ccccc1n3C(=O)OC(C)(C)C]

A liquid used in the methods herein may include any liquid in which a derivative of quinacridone is at least partially soluble. The liquid may be an organic liquid, an aqueous liquid, or a combination thereof. In some embodiments, the liquid includes isopropanol, chlorobenzene, or a combination thereof.

A derivative of quinacridone may be present in a mixture at any concentration. In some embodiments, a derivative of quinacridone is present in a mixture at a concentration of about 0.5 mg/mL to about 5 mg/mL, about 1 mg/mL to about 4 mg/mL, about 1.5 mg/mL to about 3 mg/mL, about 1.5 mg/mL to about 2.5 mg/mL, or about 1.8 mg/mL to about 2.2 mg/mL.

In some embodiments, the methods of passivating surfaces include applying the mixture to a first surface of a film. The mixtures may be applied to a first surface of a film using any known technique. In some embodiments, the applying of the mixture to the surface of the film includes spin-coating the mixture to the surface of the film.

The film to which a mixture is applied may include any one or more materials, such as any one or more materials that may be used in an electronic device. In some embodiments, the film includes a metal halide perovskite. In some embodiments, the film consists of a metal halide perovskite. In some embodiments, the film includes a metal halide perovskite and a matrix material. A metal halide perovskite may be dispersed in the matrix material. The matrix material may include a polymeric matrix material.

The film may include any metal halide perovskite. A metal halide perovskite may include an organic metal halide perovskite, an inorganic metal halide perovskite, or a hybrid metal halide perovskite. In some embodiments, the metal halide perovskite is a mixed halide perovskite (i.e., a metal halide perovskite containing at least two different halogen atoms (e.g., Br and I)). In some embodiments, the metal halide perovskite includes methylammonium lead iodide ($MAPbI_3$). Other non-limiting examples of metal halide perovskites are described in U.S. Patent Application Publication No. 2020/0270141, U.S. Patent Application Publication No. 2020/019012, U.S. Patent Application Publication No. 2019/0256535, U.S. Patent Application Publication No. 2019/0109291, U.S. Patent Application Publication No. 2019/0106325, U.S. Patent Application Publication No.

2018/0037813, U.S. Patent Application Publication No. 2017/0283693, U.S. Pat. Nos. 10,844,083, 10,774,032, 10,230,049, and 10,224,459, which are incorporated herein by reference.

In some embodiments, the methods include annealing the film for a time and a temperature effective to convert a derivative of quinacridone to quinacridone. The annealing may include any known types of annealing, such as thermal annealing or laser annealing. In some embodiments, the time is about 5 minutes to about 40 minutes, about 10 minutes to about 30 minutes, about 10 minutes to about 20 minutes, or about 14 minutes to about 16 minutes. In some embodiments, the temperature is about 125° C. to about 175° C., about 125° C. to about 165° C., about 135° C. to about 155° C., or about 140° C. to about 150° C.

Composite Materials

Composite materials also are provided herein. In some embodiments, the composite materials include a film that includes a metal halide perovskite. The film has a first side and a second side opposite the first side. The composite materials also include a coating that includes quinacridone, wherein the coating at least partially coats the first side of the film. In some embodiments, the coating consists of quinacridone. In some embodiments, the coating completely coats the first side of the film. The metal halide perovskite may include any of those described herein. In some embodiments, the metal halide perovskite includes methylammonium lead iodide ($MAPbI_3$).

The film that is at least partially coated with quinacridone may have any thickness or surface area. The thickness and surface area may be limited only by the intended use of the film, such as in an electronic device, as described herein. In some embodiments, the film has a thickness of about 450 nm to about 550 nm, about 450 nm to about 525 nm, about 460 nm to about 500 nm, or about 470 nm to about 490 nm.

Electronic Devices

Electronic devices also are provided herein. In some embodiments, the electronic devices include an electrode, a composite material as described herein, and a counter electrode. The composite material may be arranged between the electrode and the counter electrode. In some embodiments, the composite material is arranged between the electrode and the counter electrode, and in contact with one or both of the electrode and the counter electrode. The electrode and the counter electrode may be an anode and a cathode, respectively, or a cathode and an anode, respectively.

The electronic devices also may include one or more other layers. In some embodiments, the electronic devices also include one or more charge transport layers. The one or more charge transport layers may include a hole transport layer and/or an electron transport layer. In some embodiments, the electronic devices also include one or more charge injection layers. The one or more charge injection layers may include a hole injection layer and/or an electron injection layer.

In some embodiments, the electronic devices also include a charge transport layer arranged between a composite material and a counter electrode. In some embodiments, the electronic devices also include a charge transport layer, wherein (i) the electrode contacts the second side of the composite material, and (ii) the charge transport layer contacts the counter electrode and the coating that includes quinacridone.

The layers of the devices described herein may be formed of any suitable materials. In some embodiments, an electrode includes indium tin oxide; a charge transport layer includes 2,2',7,7'-tetrakis[N,N-di(4-methoxyphenyl)amino]-9,9'-spirobifluorene (spiro-OMeTAD); a counter electrode includes gold, or a combination thereof. One or more layers of the electronic devices, such as a charge transport layer, may be doped. The dopant may include an n-dopant or a p-dopant.

Figure 1:
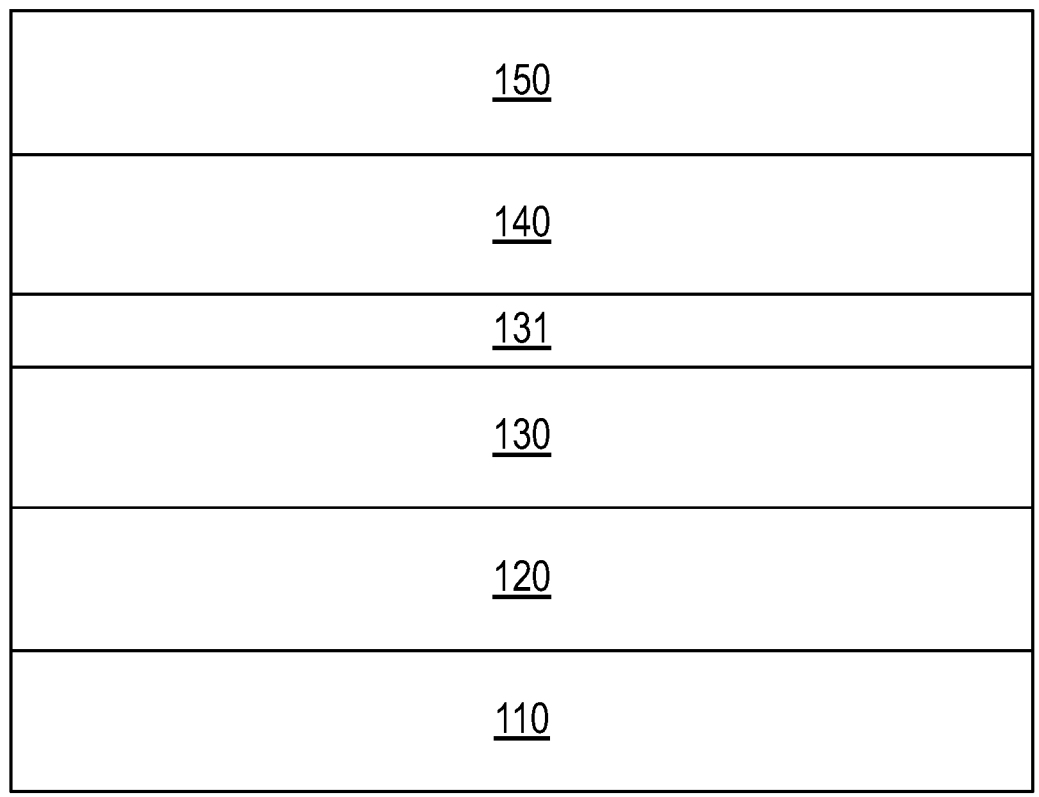
FIG. 1 depicts a schematic of an embodiment of a layer arrangement for an electronic device.

An embodiment of a layer arrangement for an electronic device is depicted at FIG. 1. The layer arrangement 100 includes a substrate 110, an electrode 120, a composite material (130, 131), a charge transport layer 140, and a counter electrode 150. The composite material is arranged between the electrode 120 and the counter electrode 150, and includes a film 130 that includes a metal halide perovskite and a coating of quinacridone 131 that completely coats a first side of the film 130. The second side of the film 130 contacts the electrode 110. The charge transport layer 140 is arranged between and in contact with both the coating of quinacridone 131 and the counter electrode 150. The substrate may include any suitable material, such as glass.

The electronic devices provided herein may include a light emitting device, such as a light emitting diode, or a photovoltaic device, i.e., a solar cell.

In some embodiments, the electronic device is a solar cell having a structure according FIG. 1, wherein the electrode includes indium tin oxide, the metal halide perovskite is $MAPbI_3$, the charge transport layer includes 2,2',7,7'-tetrakis[N,N-di(4-methoxyphenyl)amino]-9,9'-spirobifluorene (spiro-OMeTAD), and the counter electrode includes gold. Not wishing to be bound by any particular theory, it is believed that the energy levels of the quinacridone layer can permit cascading, directional hole transfer from the metal halide perovskite to a hole transport layer, while inhibiting electron transfer, which can increase hole extraction efficiencies and decrease charge recombination, respectively. Moreover, the strong interactions between quinacridone and the metal halide perovskite via C=O . . . Pb Lewis acid/base coordination can effectively reduce the surface defects of the metal halide perovskite thin film, thereby likely suppressing the trap-assisted nonradiative recombination.

In some embodiments, the solar cells described herein achieve a power conversion efficiency of at least 20% (e.g., about 21%), with significantly suppressed hysteresis. Not wishing to be bound by any particular theory, it is believed that the hydrophobicity of quinacridone coating layers can greatly increase the water contact angle, and improve the stability of metal halide perovskite films and devices.

In some embodiments, the electronic device is a solar cell, and the solar cell, after 240 hours of storage at 85° C., exhibits a power conversion efficiency that is equal to or greater than 80%, 85%, or 90% of an initial power conversion efficiency measured prior to storage.

In some embodiments, the electronic device is a solar cell, and the solar cell, after 1000 hours of storage at ambient conditions, exhibits a power conversion efficiency that is equal to or greater than 90%, 92%, or 95% of an initial power conversion efficiency measured prior to storage.

As used herein, the phrase "$C_1$-$C_5$ hydrocarbyl" generally refers to aliphatic groups containing from 1 to 5 carbon atoms. Examples of aliphatic groups, in each instance, include, but are not limited to, an alkyl group, a cycloalkyl group, an alkenyl group, a cycloalkenyl group, an alkynyl group, an alkadienyl group, a cyclic group, and the like, and includes all substituted, unsubstituted, branched, and linear analogs or derivatives thereof, in each instance having from 1 to about 5 carbon atoms.

Examples of alkyl groups include, but are not limited to, methyl, ethyl, propyl, isopropyl, n-butyl, t-butyl, isobutyl, and pentyl. Example of cycloalkyl groups include, but are not limited to, cyclopropyl, cyclobutyl, and cyclopentyl.

Representative alkenyl moieties include vinyl, allyl, 1-butenyl, 2-butenyl, isobutylenyl, and 1-pentenyl. Representative alkynyl moieties include acetylenyl, propynyl, 1-butynyl, 2-butynyl, 1-pentynyl, 2-pentynyl, 3-methyl-1-butynyl, and 4-pentynyl.

Unless otherwise indicated, the term "substituted," when used to describe a chemical structure or moiety, refers to a derivative of that structure or moiety wherein one or more of its hydrogen atoms is substituted with a chemical moiety or functional group such as alcohol, alkoxy, alkanoyloxy, alkoxycarbonyl, alkenyl, alkyl (e.g., methyl), alkynyl, alkylcarbonyloxy (—OC(O)alkyl), amide (—C(O)NH-alkyl- or -alkylNHC(O)alkyl), tertiary amine (such as alkylamino, arylamino, arylalkylamino), azo, carbamoyl (—NHC(O)O-alkyl- or —OC(O)NH-alkyl), carbamyl (e.g., $CONH_2$, as well as CONH-alkyl, CONH-aryl, and CONH-arylalkyl), carboxyl, carboxylic acid, cyano, ester, ether (e.g., methoxy, ethoxy), halo, haloalkyl (e.g., —$CCl_3$, —$CF_3$, —$C(CF_3)_3$), heteroalkyl, isocyanate, isothiocyanate, nitrile, nitro, phosphodiester, sulfide, sulfonamido (e.g., $SO_2NH_2$), sulfone, sulfonyl (including alkylsulfonyl, arylsulfonyl and arylalkylsulfonyl), sulfoxide, thiol (e.g., sulfhydryl, thioether) or urea (—NHCONH-alkyl-).

In the descriptions provided herein, the terms "includes," "is," "containing," "having," and "comprises" are used in an open-ended fashion, and thus should be interpreted to mean "including, but not limited to." When methods, composite material, or electronic devices are claimed or described in terms of "comprising" or "including" various elements or features, the methods, composite materials, or electronic devices can also "consist essentially of" or "consist of" the various components or features, unless stated otherwise.

The terms "a," "an," and "the" are intended to include plural alternatives, e.g., at least one. For instance, the disclosure of "a liquid," "a metal halide perovskite," "a charge transport layer", and the like, is meant to encompass one, or mixtures or combinations of more than one liquid, metal halide perovskite, charge transport layer, and the like, unless otherwise specified.

Various numerical ranges may be disclosed herein. When Applicant discloses or claims a range of any type, Applicant's intent is to disclose or claim individually each possible number that such a range could reasonably encompass, including end points of the range as well as any sub-ranges and combinations of sub-ranges encompassed therein, unless otherwise specified. Moreover, numerical end points of ranges disclosed herein are approximate. As a representative example, Applicant discloses that, in some embodiments, the time of annealing is about 10 minutes to about 20 minutes. This disclosure should be interpreted as encompassing values of about 10 minutes and about 20 minutes, and further encompasses "about" each of 11 minutes, 12 minutes, 13 minutes, 14, minutes, 15 minutes, 16 minutes, 17 minutes, 18 minutes, and 19 minutes, including any ranges and sub-ranges between any of these values.

The present embodiments are illustrated herein by referring to various embodiments, which are not to be construed in any way as imposing limitations upon the scope thereof. On the contrary, it is to be understood that resort may be had to various other aspects, embodiments, modifications, and equivalents thereof which, after reading the description herein, may suggest themselves to one of ordinary skill in the art without departing from the spirit of the present embodiments or the scope of the appended claims. Thus, other aspects of the embodiments will be apparent to those skilled in the art from consideration of the specification and practice of the embodiments disclosed herein.

As used herein, the term "about" refers to values within ±5% or ±1% of the numerical value associated with the term.

EXAMPLES

The present invention is further illustrated by the following examples, which are not to be construed in any way as imposing limitations upon the scope thereof. On the contrary, it is to be clearly understood that resort may be had to various other aspects, embodiments, modifications, and equivalents thereof which, after reading the description herein, may suggest themselves to one of ordinary skill in the art without departing from the spirit of the present invention or the scope of the appended claims. Thus, other aspects of this invention will be apparent to those skilled in the art from consideration of the specification and practice of the invention disclosed herein.

Unless noted otherwise, the following materials were used in the Examples. Quinacridone (QA), di-(t-butyl)-dicarbonate, N,N'-dimethylaminopyridine, $SnCl_2$, thiourea, titanium diisopropoxide bis(acetylacetonate), CsI, methylammonium iodide (MAI), methylammonium bromide (MABr), formamidinium iodide (FAI), $PbBr_2$, spiro-OMeTAD, poly[bis(4-phenyl)(2,4,6-trimethylphenyl) amine] (PTAA), bis(trifluoromethane)sulfonimide lithium salt (Li-TFSI), and 4-tert-butylpyridine (t-BP) were purchased from Sigma-Aldrich. $PbI_2$ was bought from TCI. FK 209 Co(III) $PF_6$ salt was received from Xi'an Polymer Light Technology Corp. 30 N-RD $TiO_2$ paste was purchased from Dyesol. Clevios P VP AI 4083 type PEDOT:PSS solution was purchased from Heraeus Deutschland GmbH & Co. KG. All chemicals were used without further purification.

Example 1—Synthesis of TBOC-QA

TBOC-QA was synthesized following a previously published procedure with some minor modifications (T. L. Chen, et al. *Org. Electron.* 2011, 12, 1126-1131).

In this example, 0.936 g QA pigment was dispersed in 150 mL tetrahydrofuran. Two equivalents of di-tent-butyl dicarbonate and N,N'-dimethylaminopyridine catalyst were added to the above solution and stirred for 24 hours at room temperature. The molecular structures of (a) TBOC-QA and (b) QA pigment were as follows:

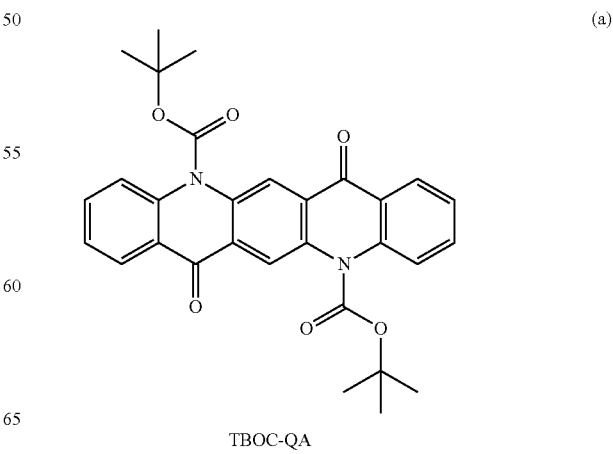

TBOC-QA

-continued

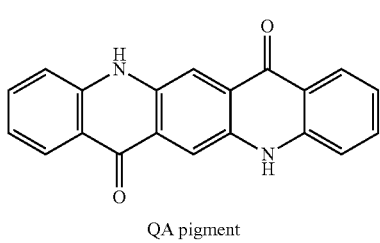

QA pigment

The reaction mixtures were dried under low pressure, and the products were purified by column chromatography using silica gel with hexane and dichloromethane as the eluents giving TBOC-QA as a yellow solid (60% yield).

Example 2—Device Fabrication

Figure 2:
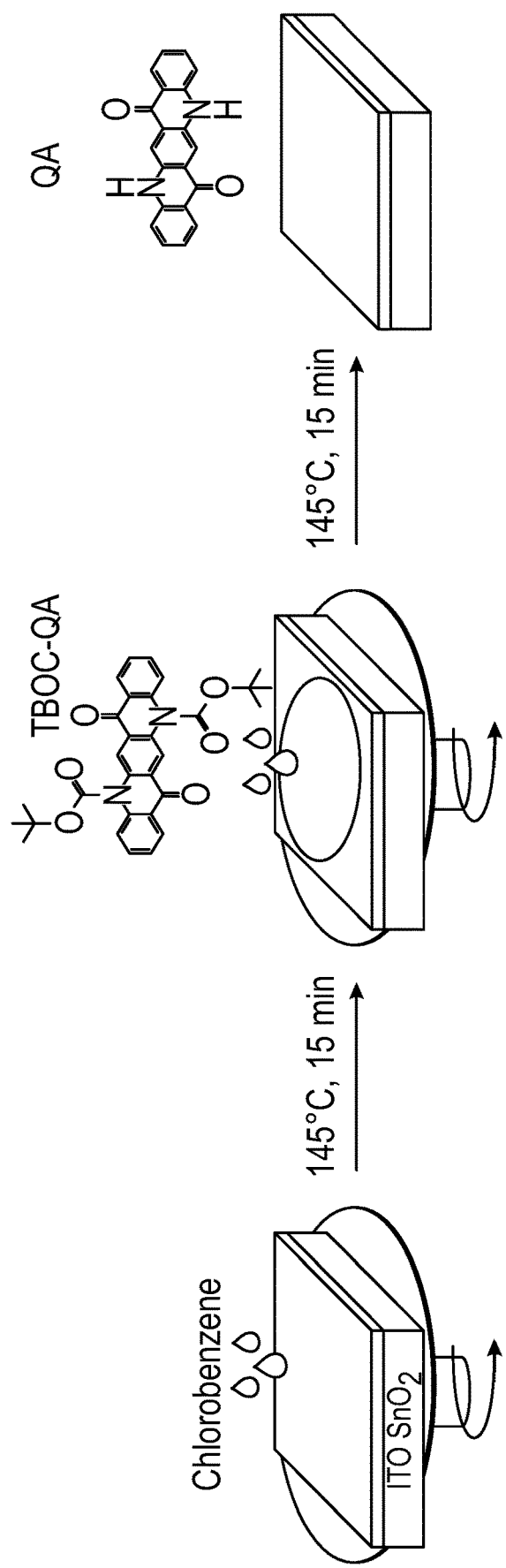
FIG. 2 depicts a schematic of an embodiment for preparing a quinacridone passivated perovskite thin film.

The procedure of coating halide perovskite thin films with QA used in this example is depicted at FIG. 2. Briefly, MAPbI$_3$ thin films were prepared via a two-step sequential spin-coating processing. To permit surface passivation of MAPbI$_3$ thin films via solution processing, a soluble derivative of QA, TBOC-QA, was synthesized following the procedure of Example 1.

A solution of TBOC-QA in isopropanol/chlorobenzene (IPA/CB, 1:1, v:v) was then spin-coated onto the MAPbI$_3$ thin films, followed by thermal annealing at 145° C. for 15 minutes to convert TBOC-QA into QA.

Figure 3:
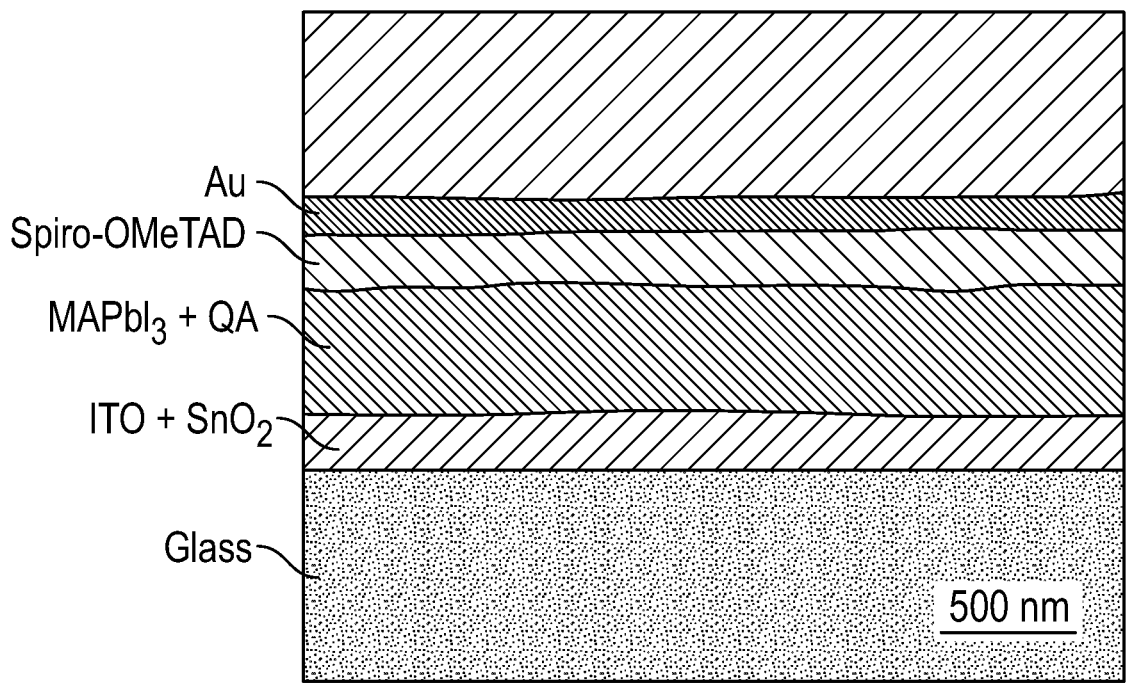
FIG. 3 depicts a schematic of a cross-section scanning electron microscope (SEM) image of an embodiment of a planar n-i-p PSC including a quinacridone passivated methyl ammonium lead iodide ($MAPbI_3$) layer.

The QA coated MAPbI$_3$ thin films were then layered with doped spiro-OMeTAD and an Au electrode to complete the PSCs. A cross-section SEM image of a complete planar n-i-p PSC was collected. A schematic of the SEM image is depicted at FIG. 3.

Figure 4:
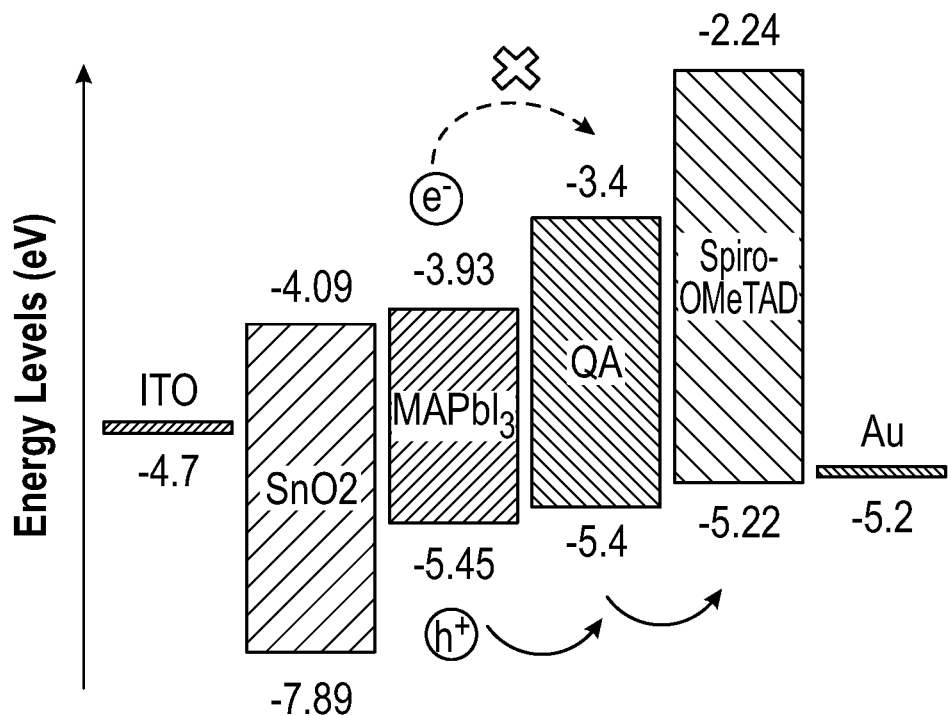
FIG. 4 depicts the relative band-edges of stacked films in an embodiment of a device.
Figure 5:
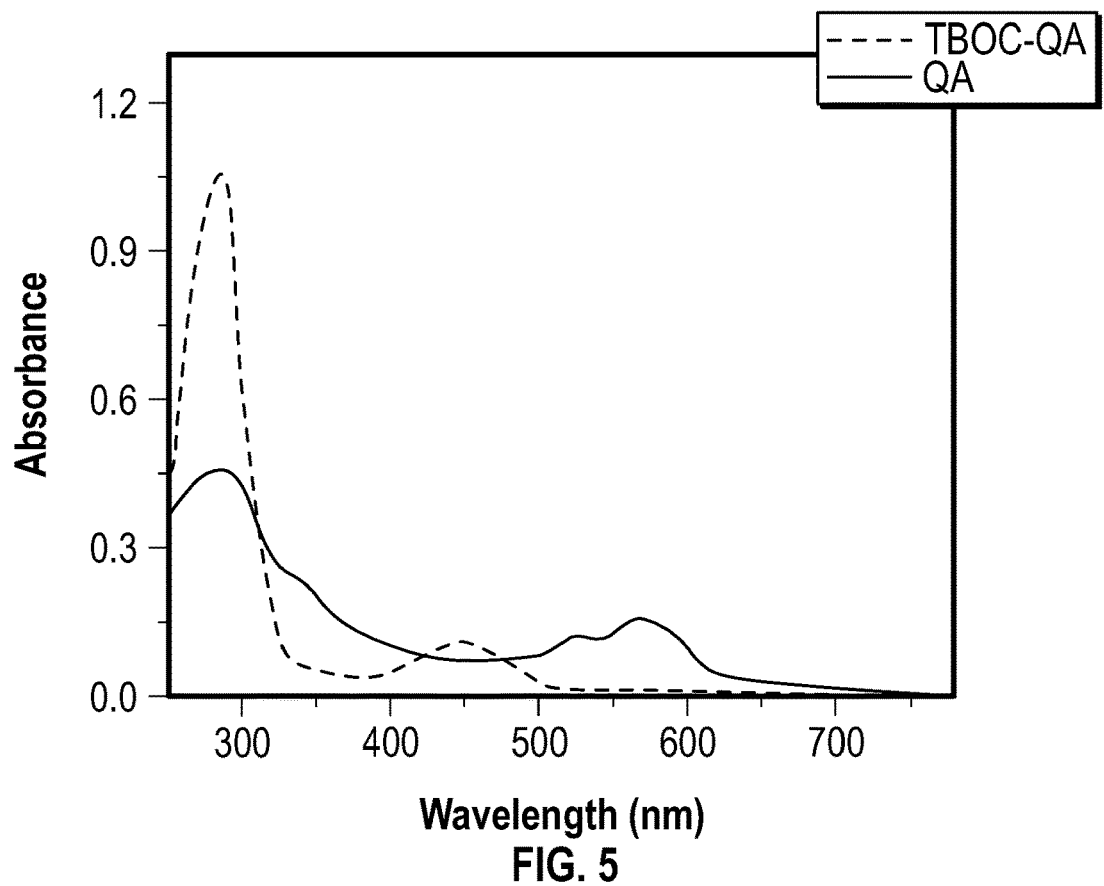
FIG. 5 depicts a UV-Vis absorption spectra of an embodiment of a spin-coated di-tert-butyl 7,14-dioxo-7,14-dihydroquinolino[2,3-b]acridine-5,12-dicarboxylate (TBOC-QA) thin film after annealing at 145° C. for 15 minutes.
Figure 6:
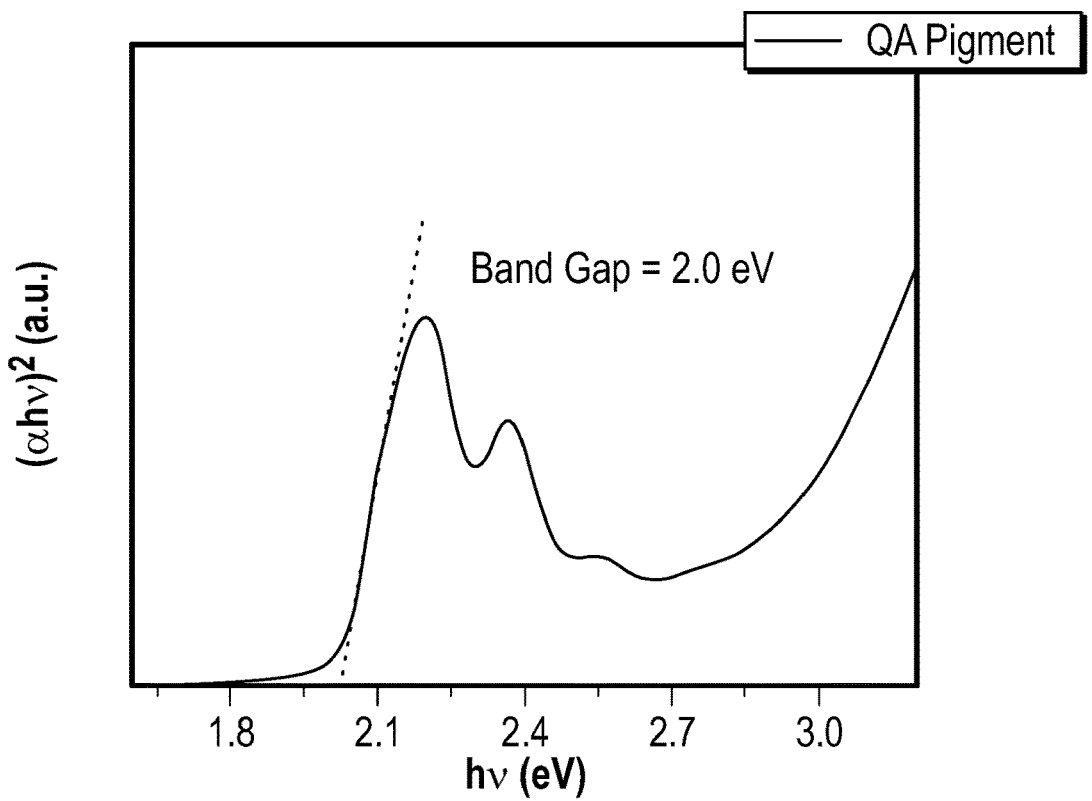
FIG. 6 depicts a band gap determination from a Tauc plot.

The corresponding band energy levels of the device are shown at FIG. 4. For QA, the highest occupied molecular orbital (HOMO) energy level was −5.4 eV according to previous reports (C.-Y. Yang, et al. *ACS Appl. Mater. Interfaces* 2016, 8, 3714-3718), while the lowest unoccupied molecular orbital (LOMO) was −3.4 eV as estimated from its 2.0 eV optical band gap (see FIG. 5 and FIG. 6).

Figure 7:
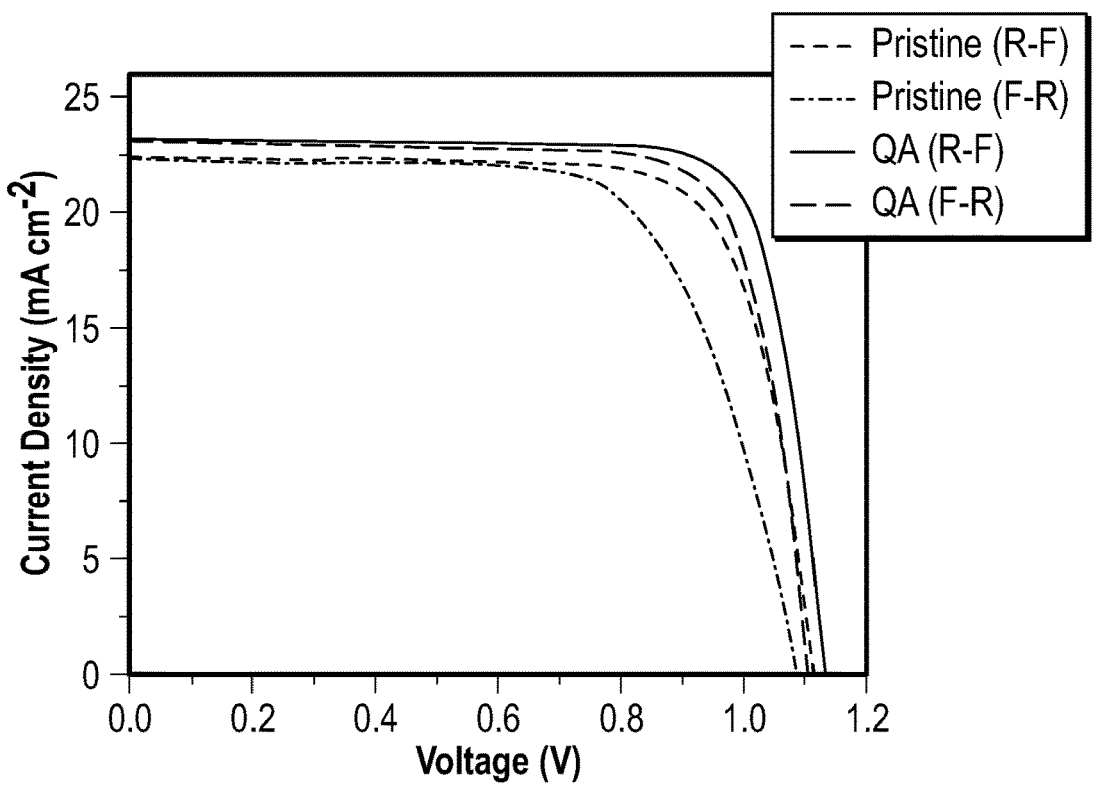
FIG. 7 depicts the photocurrent density-voltage (J-V) characteristics in reverse and forward scans of embodiments of PSCs that include pristine and quinacridone coated perovskite thin films.

As shown at FIG. 7, the HOMO energy level of QA lied between the valence band of MAPbI$_3$ and HOMO of spiro-OMeTAD, allowing the formation of a cascade energy level alignment, enabling efficient hole transport from MAPbI$_3$ to spiro-OMeTAD. The higher LOMO energy level of QA could act as an electron blocker for the photogenerated electrons in the conduction band of MAPbI$_3$, effectively reducing charge carrier recombination.

Specifically, the perovskite solar cells of this example were fabricated based on a planar n-i-p structure, i.e., ITO/SnO$_2$/MAPbI$_3$/spiro-OMeTAD/Au.

The SnO$_2$ electron transporting layer was prepared by spin-coating SnO$_2$ quantum dots (QDs) on an ultraviolet-ozone treated clean ITO substrate, which was then annealed at 200° C. for 1 hour. The SnO$_2$ QDs were synthesized according to the procedures described in literature (Q. He, et al. *J. Mater. Chem. A* 2020, 8, 2039-2046).

After being cooled to room temperature and treated with ultraviolet-ozone again, the substrate was transferred into a glove box. Then, a perovskite solution was spin-coated on the substrate via two consecutive steps of 750 rpm and 4000 rpm for 3 seconds and 20 seconds, respectively.

At the second step, 180 μL of chlorobenzene (CB) was dropped on the substrate before 10 seconds to end. The perovskite thin film was formed by annealing the sample on a hot plate at 145° C. for 15 minutes. The MAPbI$_3$ precursor solution was prepared by dissolving MAI (1.3 M) and PbI$_2$ (1.3 M) in dimethylformamide/dimethyl sulfoxide (DMF/DMSO, 4:1, v:v).

To prepare the QA passivated perovskite thin film, the TBOC-QA solution was spin-coated on the surface of glass/ITO/SnO$_2$/MAPbI$_3$ substrate at 3000 rpm for 30 seconds and annealed at 145° C. for 15 minutes. The TBOC-QA solutions (1, 2, 4, and 8 mg mL$^{-1}$) were prepared by dissolving TBOC-QA powder in a mixed solvent of isopropanol/chlorobenzene (IPA/CB, 1:1, v:v).

For references, the pristine and IPA/CB treated perovskite thin films were also annealed under the same conditions. The hole transporting layer was deposited by spin-casting doped spiro-OMeTAD solution at 4000 rpm for 20 seconds. The solution was made by dissolving 50 mg of spiro-OMeTAD into CB, which was then doped with Li-TFSI (10 μL, 517 mg/mL in acetonitrile), t-BP (18 μL), and FK 209 Co(III) PF$_6$ (4 μL, 375 mg/mL in acetonitrile). Finally, 80 nm thick of Au electrode was deposited by thermal evaporation.

The triple cation Cs$_{0.05}$(MA$_{0.17}$FA$_{0.83}$)$_{0.95}$Pb(I$_{0.83}$Br$_{0.17}$)$_3$ (CsMAFA) devices based on FTO/compact-TiO$_2$/mesoporous-TiO$_2$/Cs$_{0.05}$(MA0.17FA$_{0.83}$)$_{0.95}$Pb(I0.83Br$_{0.17}$)$_3$/PTAA/Au architecture were fabricated according to previous report with slight modifications (M. Saliba, et al. *Chem. Mater.* 2018, 30, 4193-4201).

In brief, the compact and mesoporous TiO$_2$ layers were deposited on clean FTO by spin-coating a diluted titanium diisopropoxide bis(acetylacetonate) solution (1:9 by volume in ethanol) and TiO$_2$ paste (150 mg mL$^{-1}$ in ethanol), respectively. The CsMAFA thin films were deposited by spin coating the precursor solution in a two-step protocol. For the deposition of PTAA hole transport layer, 10 mg PTAA was dissolved in 1 mL toluene and after adding 7.5 μL Li-TFSI solution (170 mg mL$^{-1}$ in acetonitrile) and 4 μL 4-tert-butylpyridine, the solution was spin-coated at 3000 rpm for 30 s inside a N$_2$ filled glovebox. The passivation process was kept the same as for the MAPbI$_3$ system, and the concentration of TBOC-QA solution was 2 mg mL$^{-1}$.

Example 3—Effect of QA Coating

Figure 8:
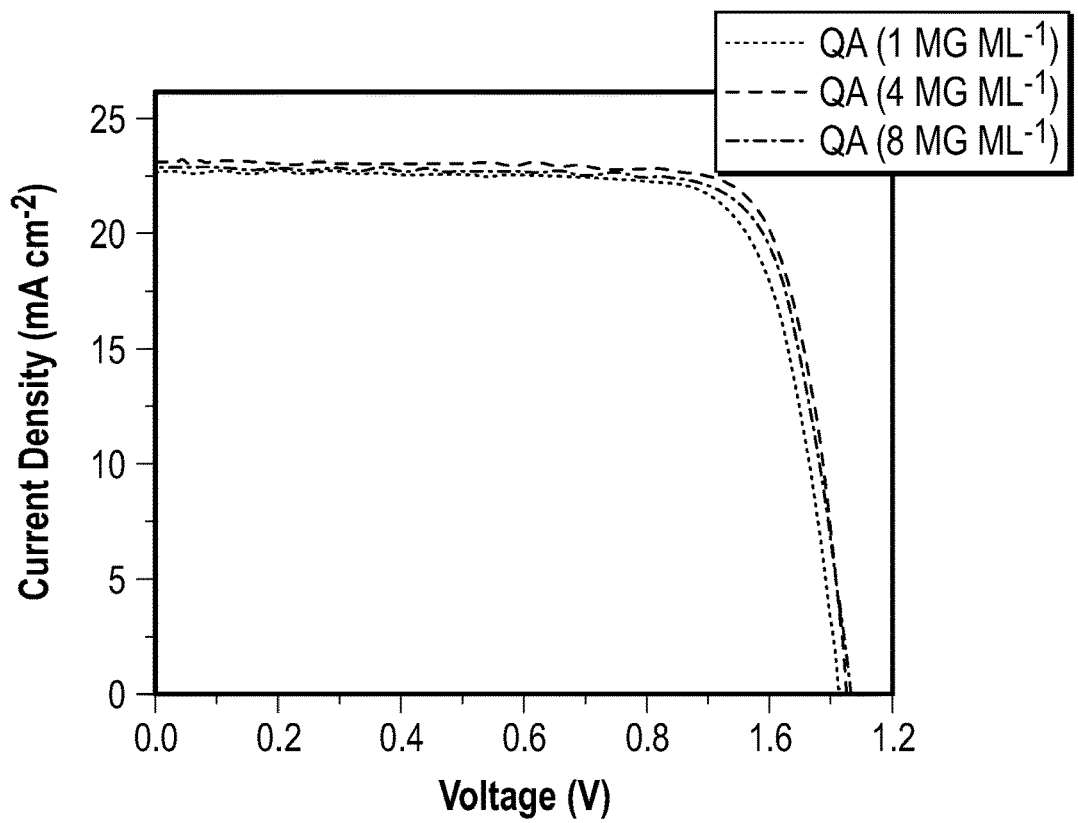
FIG. 8 depicts J-V curves of embodiments of PSCs.

The effects of QA coating on the device performance of PSCs were determined. By controlling the amount of TBOC-QA in the mixed IPA/CB solvents, a concentration for achieving a relatively high PCE was found to be 2 mg mL$^{-1}$ in this example. FIG. 8 depicts J-V curves of the PSCs based on the perovskite thin films coated by QA converted from different concentrations of TBOC-QA solutions.

TABLE 1

Photovoltaic parameters of the PSCs based on the perovskite thin films coated by QA converted from different concentrations of TBOC-QA solutions.

| Sample | $J_{SC}$ (mA/cm$^2$) | $V_{OC}$ (V) | FF | PCE (%) |
|---|---|---|---|---|
| QA (1 mg mL$^{-1}$) | 22.76 | 1.11 | 0.78 | 19.81 |
| QA (4 mg mL$^{-1}$) | 23.15 | 1.13 | 0.80 | 20.89 |
| QA (8 mg mL$^{-1}$) | 22.91 | 1.13 | 0.79 | 20.45 |

Photocurrent density-voltage (J-V) characteristics in reverse and forward scans of the best performing PSCs based on pristine and QA coated MAPbI$_3$ thin films are shown at FIG. 7. The device performance metrics are summarized in Table 2.

TABLE 2

Photovoltaic parameters of the devices based on
pristine and QA treated perovskite thin films.

| Sample | $J_{SC}$ (mA cm$^{-2}$) | $V_{OC}$ (V) | FF | PCE (%) |
|---|---|---|---|---|
| Pristine (RS)[a] | 22.52 | 1.11 | 0.76 | 18.87 |
| Pristine (FS)[b] | 22.51 | 1.09 | 0.68 | 16.59 |
| QA (RS) | 23.19 | 1.13 | 0.80 | 21.06 |
| QA (FS) | 23.17 | 1.11 | 0.78 | 20.13 |

[a]RS: reverse scan;
[b]FS: forward scan.

Figure 9:
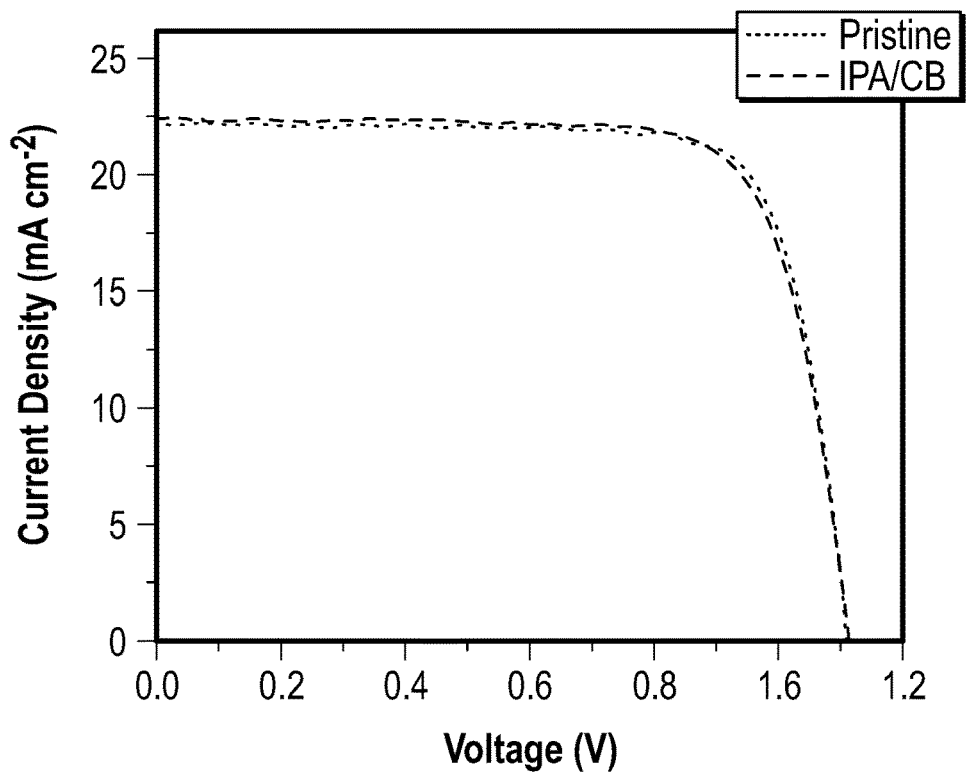
FIG. 9 depicts J-V curves of embodiments of PSCs.
Figure 10A:
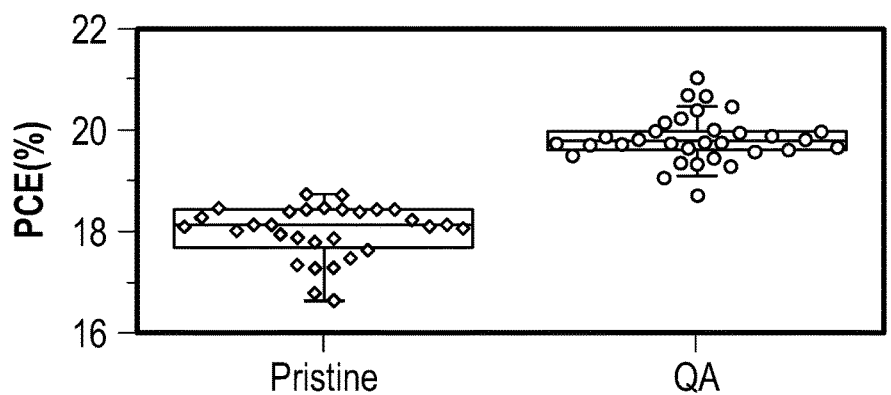
FIG. 10A, FIG. 10B, FIG. 10C, and FIG. 10D depict the statistical distribution of $J_{SC}$, $V_{OC}$, fill factor (FF), and power conversion efficiency (PCE) for embodiments of devices provided herein.
Figure 10B:
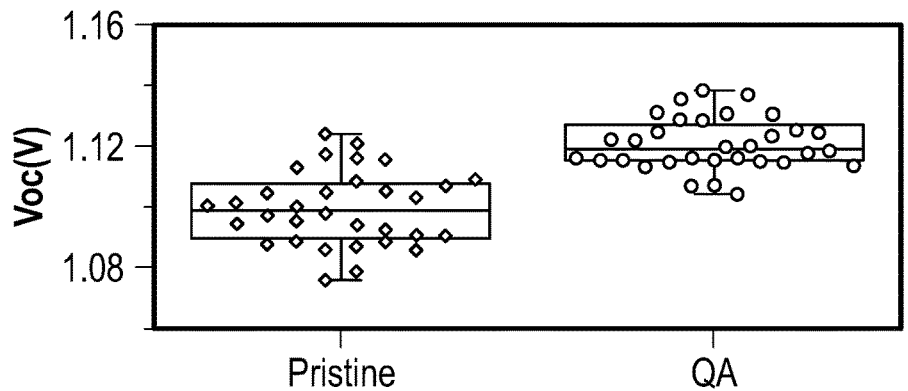
Figure 10C:
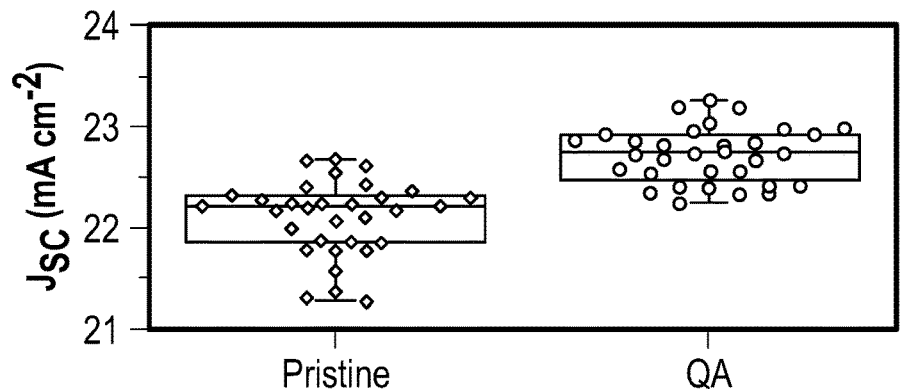
Figure 10D:
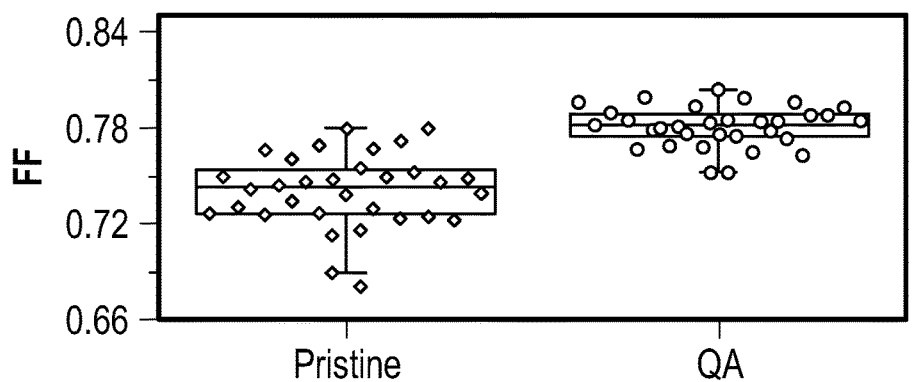

The best performing device based on pristine MAPbI$_3$ had a PCE of 18.87% with an open-circuit voltage ($V_{oc}$) of 1.11 V, a short-circuit current density ($J_{SC}$) of 22.52 mA cm$^{-2}$, and a fill factor (FF) of 0.76. With QA coating, the best performing device had an improved PCE of 21.06%, with an increased $V_{OC}$ of 1.13 V, a $J_{SC}$ of 23.19 mA cm$^{-2}$, and a FF of 0.80. To ensure that the improvement was not simply due to solvent annealing by the IPA/CB used in processing of TBOC-QA layer, PSCs based on solvent treated MAPbI$_3$ thin films, in the absence of TBOC-QA were also fabricated and tested (FIG. 9 and Table 3). FIG. 9 depicts J-V curves of the best-performing devices (of this example) based on pristine and IPA/CB (1:1, v:v) treated perovskite thin films.

TABLE 3

Photovoltaic characteristics of the best-performing
devices based on IPA treated perovskites.

| Sample | $J_{SC}$ (mA cm$^{-2}$) | $V_{OC}$ (V) | FF | PCE (%) |
|---|---|---|---|---|
| Pristine | 22.52 | 1.11 | 0.76 | 18.87 |
| IPA/CB | 22.29 | 1.11 | 0.76 | 18.96 |

The nominal improvement in PCE of 18.96%, indicated that TBOC-QA/QA played a surprising role in improving the device performance. The QA coating also surprisingly improved the hysteresis index (H=(PCE$_{reverse}$–PCE$_{forward}$)/PCE$_{reverse}$) of PSCs (FIG. 7)(S. Wu, et al. *Joule* 2020, 4, 1248-1262), with a three-fold decrease (4.5%) relative to the pristine device (12.1%). Generally, hysteresis behavior may be caused by the mobile ions and their impact on the charge carrier extraction and recombination at the interfaces of perovskite and carrier transport layers (see, e.g., S. N. Habisreutinger, et al. *ACS Energy Lett.* 2018, 3, 2472-2476). The reduction of hysteresis index was consistent with the increased hole extraction efficiency at the perovskite/hole transport material (HTM) interfaces (see, e.g., Q. He, et al. *J. Mater. Chem. A* 2020, 8, 2039-2046).

In this example, more than thirty PSCs were fabricated and tested for both pristine and QA coated MAPbI$_3$ thin films to probe the reproducibility, with the results shown at FIG. 10A, FIG. 10B, FIG. 10C, and FIG. 10D. The average performance characteristics of these PSCs are summarized at Table 4.

TABLE 4

Average photovoltaic parameters of PSCs based
on pristine and QA treated perovskite layers.

| Sample | $J_{SC}$ (mA cm$^{-2}$) | $V_{OC}$ (V) | FF | PCE (%) |
|---|---|---|---|---|
| Pristine | 22.10 | 1.10 | 0.74 | 17.92 |
| QA | 22.74 | 1.12 | 0.78 | 19.92 |

Figure 11:
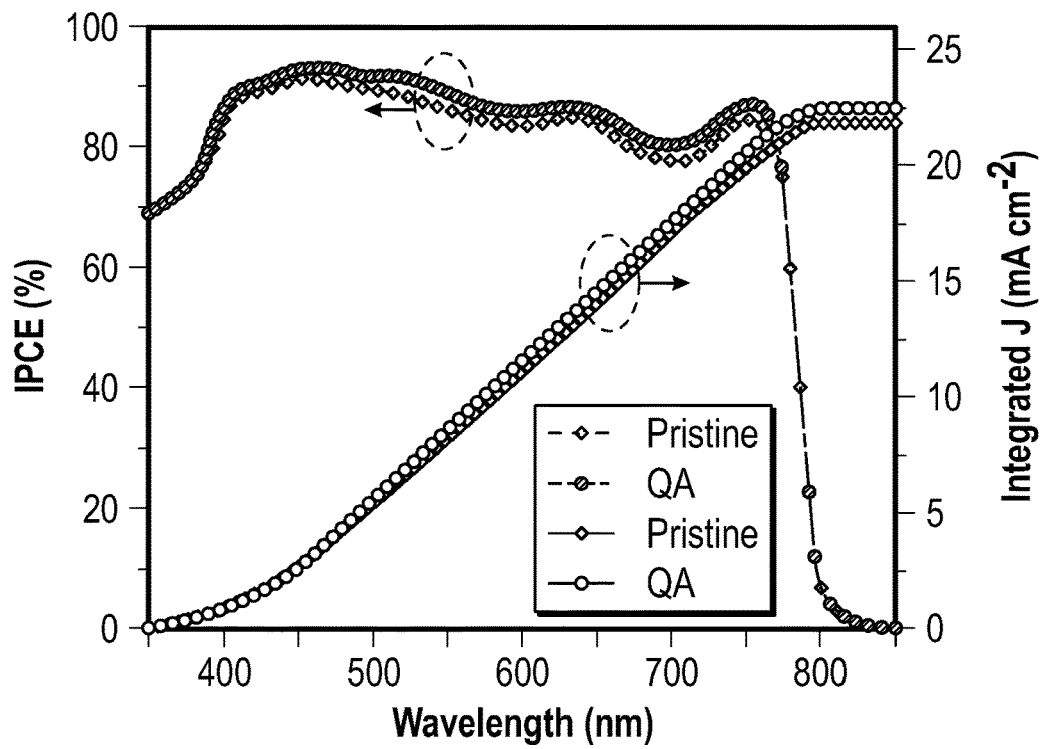
FIG. 11 depicts the incident photon conversion efficiency (IPCE) and the corresponding integrated $J_{SC}$ curves of embodiments of PSCs provided herein.

The devices based on pristine MAPbI$_3$ thin films gave an average $V_{OC}$ of 1.10 V, a $J_{SC}$ of 22.10 mA cm$^{-2}$, a FF of 0.74, and a PCE of 17.92%. When treated with QA, the parameters were clearly enhanced to an average $V_{OC}$ of 1.12 V, a $J_{SC}$ of 22.74 mA cm$^{-2}$, a FF of 0.78, and a PCE of 19.92%. All the photovoltaic parameters of PSCs were well matched with their best-performing results, indicating reliability of the fabrication and testing results. The incident photon conversion efficiencies (IPCEs) of the pristine and QA coated devices were also recorded and the results are shown in FIG. 11. The QA coated devices exhibited better IPCEs than the pristine devices across the entire wavelength range (350-800 nm).

Example 4—Characterizations

To gain a further understanding of the impact of QA coating on device performance, the morphological, electronic, and photophysical properties of QA coated MAPbI$_3$ thin films were characterized.

The same X-ray diffraction (XRD) patterns of pristine and QA coated MAPbI$_3$ thin films suggested that a QA coating did not change the tetragonal phase of MAPbI$_3$. UV-Vis absorption spectra of the MAPbI$_3$ thin films also displayed little-to-no change after QA coating, implying the same light absorption behavior of these samples.

To further characterize the effects of QA coating on the film morphology, SEM images of the corresponding MAPbI$_3$ thin films. While perovskite crystallites with the size of a few hundred nanometers were clearly observed in both samples, irregularly shaped small spots appeared after QA coating, indicating the possible formation of new species on the surfaces of MAPbI$_3$ thin films.

Atomic force microcopy (AFM) and Kelvin probe force microscopy (KPFM) measurements were performed under a nitrogen atmosphere, and the results were in good agreement with the observations by SEM measurement. For the QA coated sample, nanoparticles of tens of nanometers covered the surface of MAPbI$_3$ thin film, further confirming surface coating by QA. The QA coated MAPbI$_3$ thin film also exhibited a higher surface potential than that of pristine MAPbI$_3$ thin film, which was likely attributed to the reduction of surface defects caused by dangling bonds (N. Adhikari, et al. *ACS Appl. Mater. Interfaces* 2015, 7, 26445-26454). It is well known that the presence of these dangling bonds/defects increases the rate of nonradiative recombination of photogenerated charge carriers (N. Adhikari, et al. *ACS Appl. Mater. Interfaces* 2015, 7, 26445-26454; and E. Aydin et al. *Adv. Mater.* 2019, 31, 1900428).

Thus the reduction of surface defects by the QA coating likely contributed to the improved the photovoltaic performances shown in FIG. 7, FIG. 10A, FIG. 10B, FIG. 10C, FIG. 10D, and FIG. 11.

Figure 12:
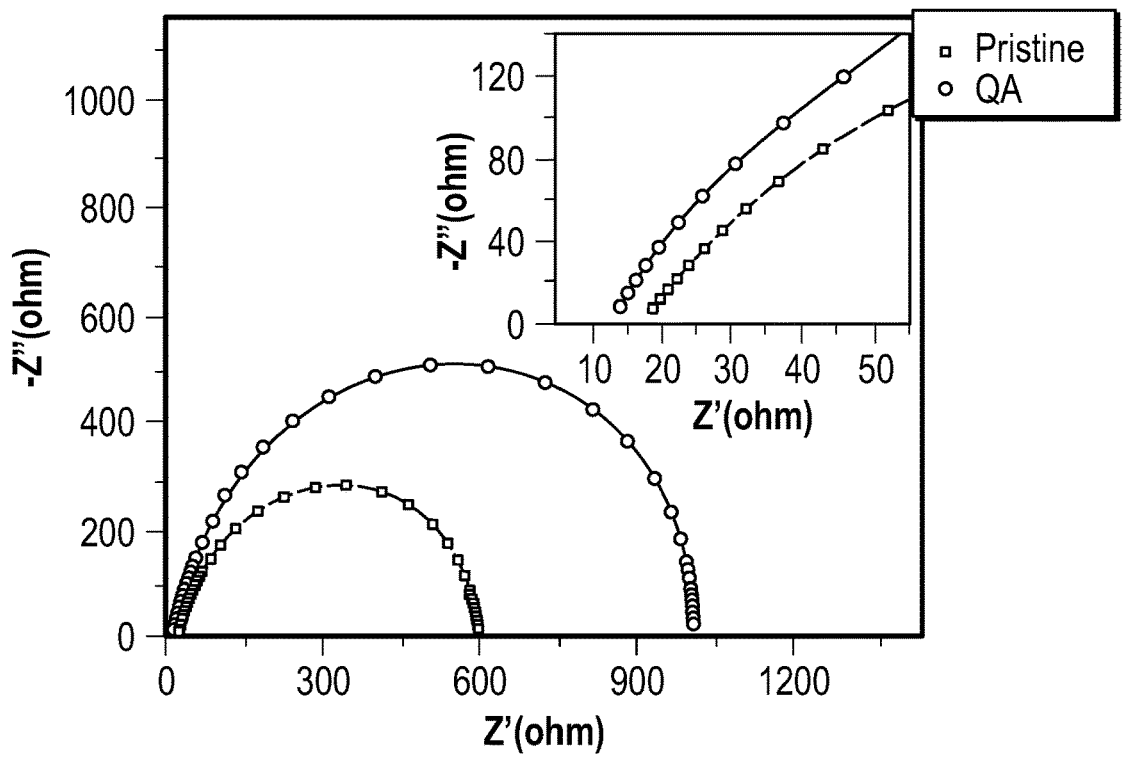
FIG. 12 depict Nyquist plots of embodiments of PSCs measured at a bias voltage of 0.8 V under AM 1.5G illumination.

Electrochemical impedance spectroscopy (EIS) was conducted to probe the resistance and charge transfer kinetics of the PSCs, and the results are shown in FIG. 12, with fitting parameters summarized in Table 5.

TABLE 5

EIS parameters of PSCs based on different perovskite layer.

| Sample | $R_s$ (Ω) | $R_{ct}$ (Ω) | $R_{rec}$ (Ω) | $CPE_{ct}$-T | $CPE_{ct}$-P | $CPE_{rec}$-T | $CPE_{rec}$-P |
|---|---|---|---|---|---|---|---|
| Pristine | 18.6 | 79.9 | 489.1 | 3.12E–08 | 1.00 | 1.16E–08 | 1.05 |
| QA | 14.1 | 56.5 | 925.8 | 1.82E–09 | 1.19 | 6.67E–09 | 1.06 |

Figure 13:
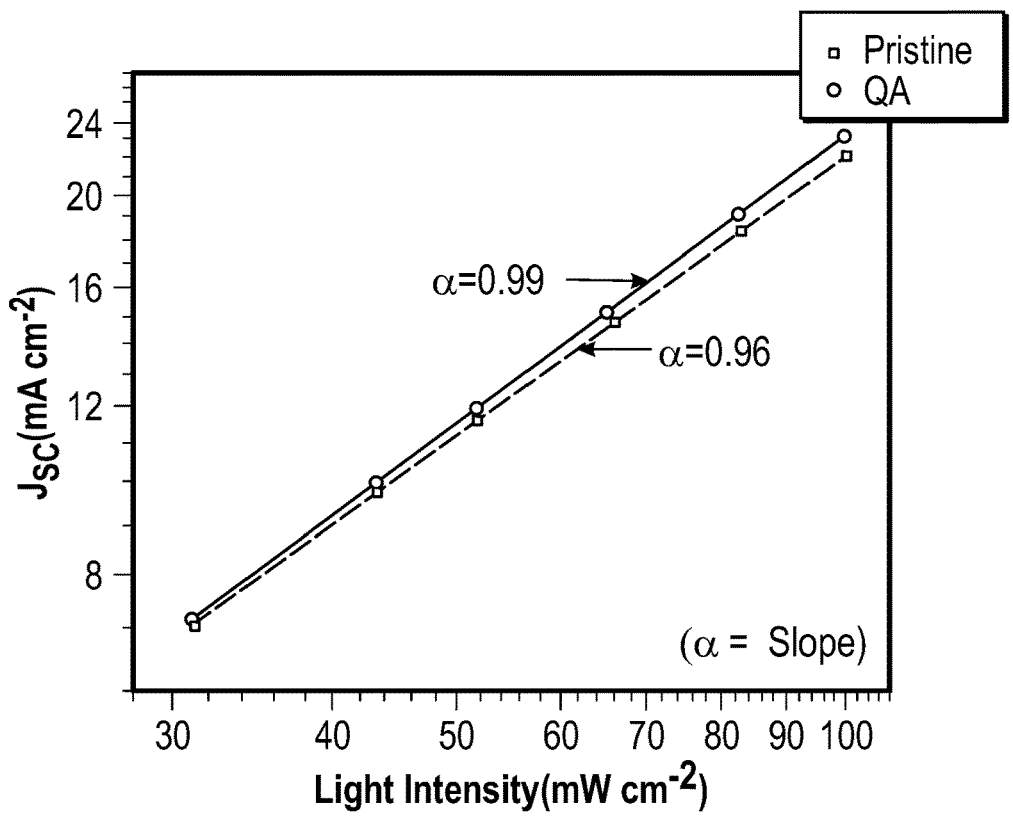
FIG. 13 depicts $J_{SC}$ versus incident light intensity for embodiments of PSCs based on embodiments of pristine and quinacridone passivated perovskite thin films.

In the equivalent circuit (FIG. 13), the $R_s$ calculated from the intersection of high frequency imaginary impedance on the X-axis is the series resistance of a PSC, while the $R_{ct}$ and $R_{rec}$ ascribed to the high frequency and low frequency elements were the charge transport resistance and recombination resistance, respectively.

The QA coated device had a $R_s$ of 14.1Ω, lower than that of the pristine device at 18.6Ω, which suggested more efficient charge transfer in the device. HOMO energy of QA was appropriate to form a cascade with MAPbI$_3$ and spiro-OMeTAD, resulting in the improvement of FF from 0.76 to 0.80, as shown in FIG. 4. The smaller $R_{ct}$ (56.5Ω) and larger $R_{rec}$ (925.8Ω) of the QA coated device, as compared to those of the pristine device with values of 79.9Ω and 489.1Ω, suggested more efficient hole extraction and suppressed charge recombination at the interfaces.

Figure 14:
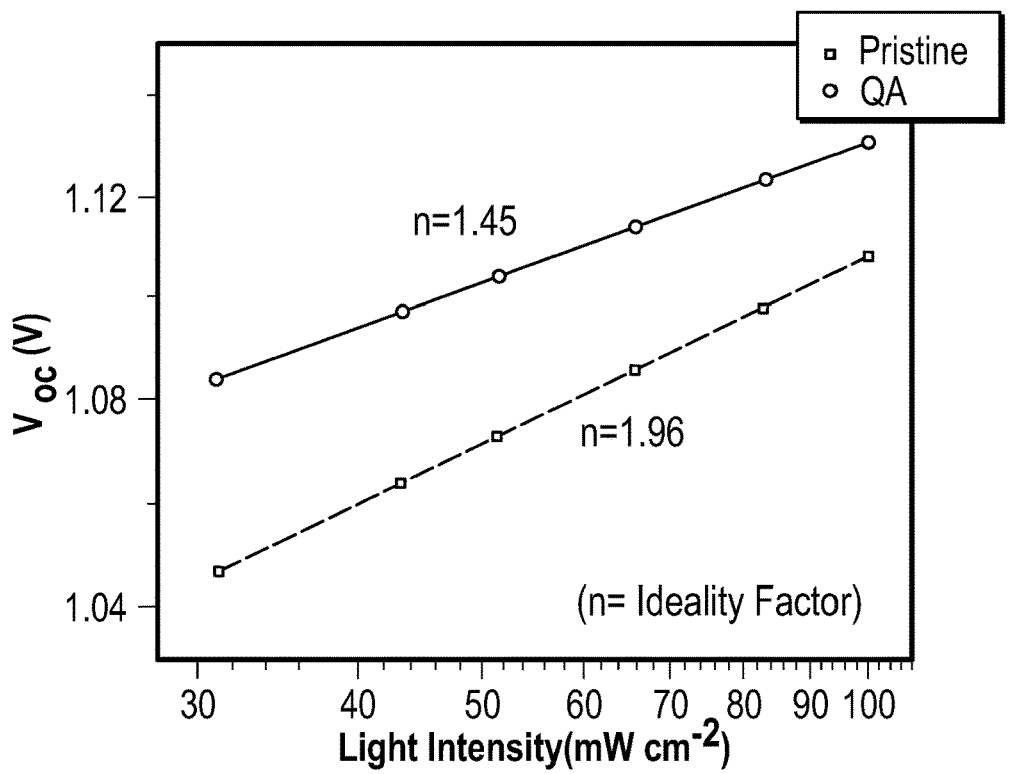
FIG. 14 depicts $V_{OC}$ versus incident light intensity for embodiments of PSCs based on embodiments of pristine and quinacridone passivated perovskite thin films.

Light intensity dependent $J_{SC}$ and $V_{OC}$ measurements were then performed to ascertain the charge recombination kinetics of the PSCs. From a linear fit of the $J_{SC}$ versus intensity data (FIG. 13), the QA coating shows a greater slope (0.99) than that of the pristine device (0.96), signifying the enhanced charge extraction in the former likely due to decreased trap density at the passivated interfaces. The $V_{OC}$ versus light intensity is depicted in FIG. 14. The ideality factor (n) can be calculated from the $V_{OC}$ and light intensity ($P_{light}$) using the equation (1):

$$n = \frac{q}{k_B T} \frac{dV_{OC}}{d\ln(P_{light})} \quad (1)$$

where $k_B$ is the Boltzmann constant, q is elementary charge of the electron, and the n is representative of the charge carrier recombination process. In general, if the n value approaches unity, the device performance likely is dominated by bimolecular recombination, i.e. the recombination of free electrons and holes in the perovskite layer. When n approaches 2, the trap-assisted Shockley-Read-Hall (SRH) charge carrier recombination likely is dominant.

Next, n values of 1.96 and 1.45 for the pristine and QA coated devices, respectively were determined, which indicated that a trap-assisted SRH recombination process was occurring at the charge collection interfaces. The decreased n value for the device with QA coating likely suggested the suppression of trap-assisted SRH recombination due to reduced trap-state density, which manifested in the increased FF and PCE (FIG. 10A-FIG. 10D).

Figure 15:
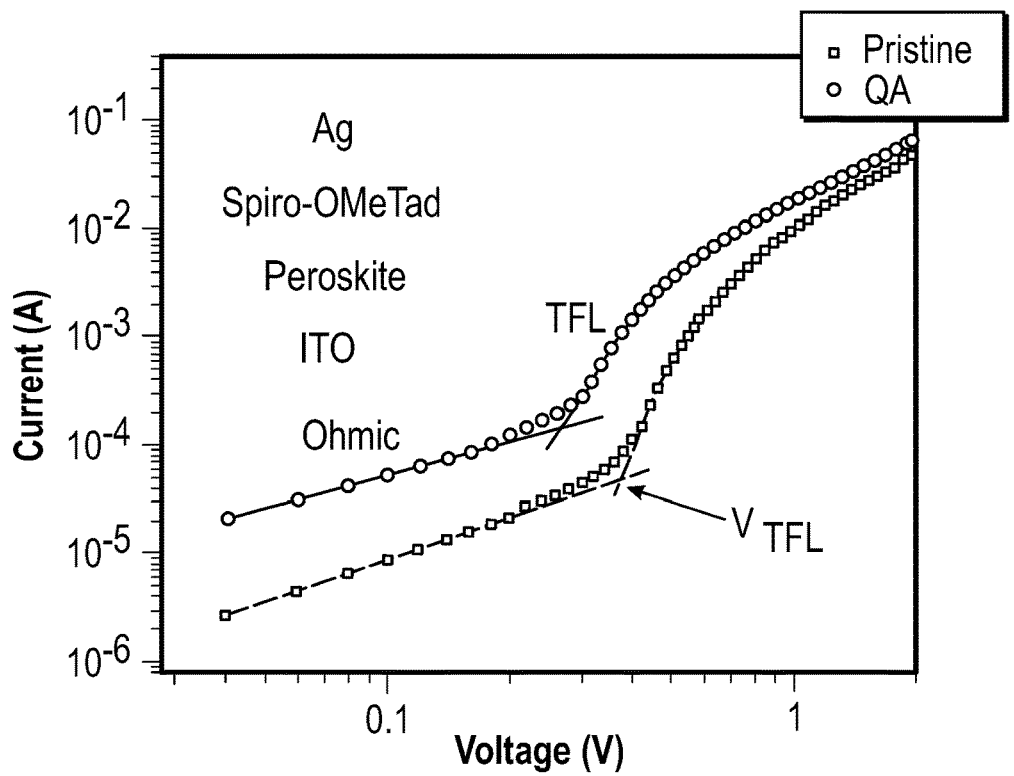
FIG. 15 depicts dark current-voltage (I-V) curves of embodiments of hole-only devices (device structure.

The reduction of trap-state density in QA coated perovskite thin films was also confirmed by the quantitative characterization of hole-only devices via a space-charge-limited current (SCLC) method (FIG. 15). At the region of low bias voltage, the linear relation indicated an ohmic response of the device, while the current increased quickly as the voltage went up and exceeded the kink point, signifying the trap-states were likely fully filled. The trap-state density ($n_t$) could be calculated from the trap-filled limit voltage ($V_{TFL}$) using the equation (2):

$$n_t = \frac{2\varepsilon\varepsilon_0 V_{TFL}}{eL^2} \quad (2)$$

wherein ε represents the relative dielectric constant of perovskite (ε=28.8 for MAPbI$_3$), $\varepsilon_0$ is the vacuum permittivity, and L is the thickness of the perovskite layer.

From the cross-section SEM image (FIG. 3) the perovskite thickness was determined to be ~480 nm. As shown in FIG. 15, the VTFL of pristine and QA coated thin films were 0.39 and 0.26 V giving $n_t$ values of $5.39\times10^{15}$ and $3.60\times10^{15}$ cm$^{-3}$, respectively. The lower value for the device with QA coating again supported the conclusion that the hole trap-state density of perovskite thin films was greatly reduced by QA passivation, resulting in lower charge recombination and increased fill factor, as shown in FIG. 10A-FIG. 10D.

To further probe the effect of QA coating on the charge transfer dynamics between perovskite layer and HTM, steady-state photoluminescence (PL) and time-resolved PL (TRPL) spectra were recorded for glass/perovskite/HTM devices. The QA coated MAPbI$_3$ thin film exhibited stronger PL quenching (FIG. 16) and decreased excited state lifetime of 8.8 ns (FIG. 17, Table 6) relative to the pristine film (13.8 ns). This emission quenching was consistent with more rapid and efficient hole extraction at the perovskite/HTM interfaces and the increased FF and reduced hysteresis index.

TABLE 6

Fitted parameters for time resolved PL decay of devices based on different perovskite films (architecture: glass/perovskite/spiro-OMeTAD). A biexponential decay model was used.

| Sample | $\tau_1$ (ns) | $\tau_2$ (ns) | $A_1$ (%) | $A_2$ (%) | $\tau_{ave}$ (ns) |
|---|---|---|---|---|---|
| Pristine | 3.8 | 26.2 | 89.5 | 10.5 | 13.8 |
| QA | 3.2 | 22.7 | 94.6 | 5.4 | 8.8 |

Flourier transform infrared (FTIR) spectra were recorded to gain a better understanding of the interactions between QA coating and the MAPbI$_3$ thin film underneath, with results shown at FIG. 18. In comparison to the pristine film, several new absorption features were observed for the QA treated MAPbI$_3$ thin films (dotted oval of FIG. 18) that were consistent with the presence of QA. The characteristic stretching vibration of the C=O in QA shifted from 1625 cm$^{-1}$ to ~1616 cm$^{-1}$ upon deposition on the MAPbI$_3$ thin film. This shift could have been the result of a O . . . Pb coordination bonding via Lewis base-acid interaction between the C=O bond of QA and Pb$^{2+}$ in the MAPbI$_3$ thin film. The FTIR spectra for PbI$_2$ and QA treated PbI$_2$ were recorded to further verify this hypothesis. It was found that the shift of the C=O vibration in QA treated PbI$_2$ followed the same trend as that of QA coated MAPbI$_3$ thin films. These results confirmed that QA interacted with the MAPbI$_3$ though Lewis base-acid coordination between C=O and Pb$^{2+}$. The carbonyl stretch for the ester groups of TBOC-QA at ~1744 cm$^{-1}$ disappeared after annealing, indicating the complete conversion of TBOC-QA into QA.

X-ray photoelectron spectroscopy (XPS) was conducted to further explore the nature of interactions between QA and MAPbI$_3$. Increased relative peak intensities and newly appeared peaks of C 1 s and O 1 s core levels for the QA coated sample confirmed the presence of QA on the MAPbI$_3$ surface. High-resolution XPS spectra of the pristine MAPbI$_3$ thin film showed two peaks located at 137.9 and 142.8 eV, corresponding to the Pb 4f 7/2 and Pb 4f 5/2 core levels, respectively. Two additional peaks at 136.3 and 141.2 eV were assigned to metallic Pb) (Pb$^0$) sites presumably due to evaporation of I$^-$ ions and formation of under-coordinated Pb$^{2+}$ sites during thermal treatment. The Pb$^0$ defects could act as recombination centers that hindered the photovoltaic performance of PSCs. With QA coating on MAPbI$_3$ thin films, the Pb$^0$ peaks disappeared, suggesting the QA coating on MAPbI$_3$ thin films not only restricted the evaporation of iodide but also passivated the of Pb$^0$ defects via the strong interactions between QA and MAPbI$_3$.

To better understand the interactions between QA and MAPbI$_3$, density functional theory (DFT) calculations were performed. In the calculations, a PbI$_2$ terminated symmetric slab was constructed from the partially relaxed tetragonal MAPbI$_3$. The slab consisted of 2×2 periodicity in the a-b plane and three layers of PbI$_2$ layers in the c axis. A 4×4×1 k-point mesh was adopted for Brillouin-zone sampling. Afterward, the QA molecule was placed on the (001) PbI$_2$ terminated perovskite surface orthogonally.

The optimized difference charge density distribution of QA and MAPbI$_3$ were graphically recorded. In agreement with the FTIR results (FIG. 18), the O atom of C═O group in QA was anchored to the exposed Pb atom with bond length of 3.04 Å. Moreover, the characteristics of electron loss were observed on H atoms of benzyl group close to MAPbI$_3$ surface indicating the Coulomb interaction between H and I. This interaction could have helped suppress the evaporation of iodine in MAPbI$_3$ during annealing process. The interaction energy between the QA molecule and the perovskite surface was calculated as: $E_{interactions} = E_{perovskite-molecule} - E_{perovskite} - E_{molecule}$, and the value was found to be as high as −3.29 eV. As could be inferred from the charge density difference isosurface, the C═O group on the QA molecule strongly interacted with the Pb$^{2+}$ on the perovskite surface.

To evaluate the universality of this passivation strategy, PSCs based on triple cation Cs$_{0.05}$(MA$_{0.17}$FA$_{0.83}$)$_{0.95}$Pb(I$_{0.83}$Br$_{0.17}$)$_3$ (CsMAFA) perovskite thin films were fabricated and tested. The J-V characteristics of the best-performing PSCs based on pristine and QA coated CsMAFA thin films were plotted, and the corresponding device performance metrics are summarized in Table 7.

TABLE 7

Photovoltaic characteristics of the best-performing devices based on pristine and QA coated CsMAFA thin films.

| Sample | $J_{SC}$ (mA cm$^{-2}$) | $V_{OC}$ (V) | FF | PCE (%) |
| --- | --- | --- | --- | --- |
| Pristine | 22.63 | 1.10 | 0.77 | 19.36 |
| QA | 23.21 | 1.14 | 0.80 | 21.17 |

The pristine device based on CsMAFA thin film had a PCE of 19.36% with an V$_{oc}$ of 1.10 V, a J$_{SC}$ of 22.63 mA cm$^{-2}$, and a FF of 0.77. With QA coating, an improved PCE of 21.17%, with an increased V$_{OC}$ of 1.14 V, a J$_{SC}$ of 23.21 mA cm$^{-2}$, and a FF of 0.80, were achieved. This result suggested that this QA passivation strategy could be extended to other type of perovskite systems for efficient and stable PSCs.

Besides surface passivation, the hydrophobicity and insolubility of the QA layer benefited the stability of QA coated perovskite thin films. Static contact angle measurements were performed to evaluate the surface hydrophobicity of the perovskite thin films. The pristine MAPbI$_3$ thin film showed a contact angle of 35.6°, which was significantly increased to 77.2° after QA coating. The water infiltration and diffusion characteristics of perovskite thin films were then examined by comparing the diffusion area of water droplet. It was observed that a water droplet on a pristine MAPbI$_3$ thin film diffused to about 10 mm in 15 seconds, while a similar drop on a QA passivated MAPbI$_3$ thin film retained its initial size even after 20 minutes.

Thus, the QA passivated film exhibited lower moisture infiltration and diffusion rates. It was anticipated that the hydrophobicity and slowed infiltration/diffusion rates of the QA layer would inhibit moisture attack of the perovskite layer. XRD patterns of pristine and QA passivated perovskite thin films before and after exposure to ambient conditions, respectively were collected. After exposure for one month, the pristine sample discolored and scaled from the substrate, and the formation of PbI$_2$ and MAPbI$_3$·H$_2$O was observed, likely due to the decomposition and hydration of MAPbI$_3$. In contrast, the QA coated MAPbI$_3$ thin film displayed impressive stability with little-to-no change of the color and phase after storage in ambient conditions for one month.

To investigate the effects of QA coating on the device stability, the change of PCEs was examined for the pristine and QA passivated MAPbI$_3$ thin films under long-term storage and continuous illumination in ambient conditions. The device based on pristine MAPbI$_3$ showed a significant reduction of PCEs with 80.4% performance loss after storing in 50-60% relative humidity (RH) at room temperature for 1000 hours.

In comparison, the device with QA coating retained 89.7% of its initial PCE with only a 10.3% reduction in performance over 1000 hours. Under continuous illumination, the unencapsulated device with QA coating retained 85.5% of its initial PCE after exposure to AM 1.5G for 48 hours. In contrast, the pristine MAPbI$_3$ device exhibited a much faster decline in performance to 21.2% of its initial PCE. These results strongly indicated that the hydrophobic and insoluble QA layer served as a protective coating against degradation of the perovskite layer by moisture.

The high temperature stability of the devices stored in a N$_2$ environment at 85° C. were also measured. The spiro-OMeTAD HTM was replaced by polytriarylamine (PTAA), considering that the mobility of lithium ion dopants would lead to quick device degradation when the temperature goes over 50° C. for thermal stability testing. The J-V curves and corresponding photovoltaic parameters of the PSCs with PTAA HTM were collected, and the results are depicted at Table 8.

TABLE 8

Photovoltaic characteristics of the best-performing devices based on PTAA HTL.

| Sample | $J_{SC}$ (mA cm$^{-2}$) | $V_{OC}$ (V) | FF | PCE (%) |
| --- | --- | --- | --- | --- |
| Pristine | 22.25 | 1.10 | 0.76 | 18.63 |
| QA | 23.05 | 1.13 | 0.80 | 20.91 |

The pristine and passivated devices showed a PCE of 18.63% and 20.91%, respectively. The QA passivated device maintained 85.7% of its initial PCE after 240 hours of storage at 85° C., which was significantly better than that of pristine MAPbI$_3$ device (44.3%).

UV-Vis absorption spectra of perovskite thin films were measured on CARY 5000 UV-Vis NIR spectrophotometer (Agilent Technologies). X-Ray diffraction spectra were recorded by SmartLab X-ray diffractometer (Rigaku Corporation) with Cu Kα radiation. Scanning electron microscopy images were captured by Nova NanoSEM 400 (FEI Company) at 3.0 KV scanning voltage. Atomic force microscope and Kelvin probe force microscopy measurements were performed on surface of perovskite thin films in ambient conditions using Icon scanning probe microscope (Bruker Corporation) in a single-pass frequency modulated (FM-KPFM) mode.

The contact angles of perovskite thin films with water drops were measured by CAM 200 optical tensiometer (KSV Instruments). Fourier transform infrared (FTIR) spectra were recorded by FT/IR-6800 FTIR Spectrometer (JASCO International Co., Ltd.). X-ray photoelectron spectroscopy (XPS) was conducted using a PHI 5000 series XPS with Kα radiation of Al. Charge compensation was performed using adventitious C 1s peak (284.6 eV). Spectra background were fitted and subtracted using an integrated Shirley function. XPS curves were deconvoluted using a Voight peak function for metal core electron spectra and gaussian peak functions for the rest.

Steady-state photoluminescence measurements of perovskite films without and with HTL were performed on FS5 spectrofluorometer (Edinburgh Instruments). The corresponding time-resolved PL curves were recorded by the same instrument which equipped a 450 nm laser (EPL-450, Edinburgh Instruments). The carrier lifetimes were fitted with a biexponential function $y=A_1\times\exp(-x/\tau_1)+A_2\times\exp(-x/\tau_2)+y_0$. The weighted average lifetimes were calculated by $<\tau>=\Sigma A_i\tau_i^2/\Sigma A_i\tau_i$. The current density-voltage characteristics of perovskite solar cells were taken using the IV5 Solar Cell I-V Measurement System (PV Measurements, Inc.). The electrochemical impedance spectroscopy measurement was carried out on a Gamry Interface 1000E potentiostat under AM 1.5G illumination in the frequency range from 10 Hz to 1 MHz with an alternative signal amplitude of 10 mV, in which the potential bias was fixed at 0.8 V. All the devices were covered by a mask with the active area of ~0.15 cm$^2$ and measured under the illumination of AM 1.5G in ambient condition. The incident photon-to-electron conversion efficiency (IPCE) measurement was carried out by using QEX10 (PV Measurements, Inc.).

Example 5—DFT Calculations

A PbI$_2$ terminated symmetric slab was constructed from the partially relaxed tetragonal MAPbI$_3$ reported in the literature (K. Frohna, et al. Nat. Commun. 2018, 9, 1829).

The slab consisted of 2×2 periodicity in the a-b plane and three layers of PbI$_2$ layers in the c axis separated by 20 A of vacuum. First principles calculations were carried out using the quantum espresso package (P. Giannozzi, et al. J. Phys.: Condens. Matter 2009, 21, 395502).

The revised Perdew-Burke-Ernzerh of generalized gradient approximation (PBEsol) was used for exchange-correlation along with Grimme's DFT-D3 Van der Waals correction (J. P. Perdew et al. Phys. Rev. Lett. 1996, 77, 3865-3868; J. P. Perdew et al. Phys. Rev. Lett. 2008, 100, 136406; S. Grimme, et al. J. Chem. Phys. 2010, 132, 154104; S. Grimme, J. Comput. Chem. 2006, 27, 1787-1799; and P. E. Blochl, et al. Phys. Rev. B 1994, 49, 16223-16233).

The ion cores were described using projector-augmented wave (PAW) psuedopotentials (P. E. Blochl, et al. Phys. Rev. B 1994, 49, 16223-16233). The plane-wave expansion cutoff was set at 22 Ry and charge density cutoff at 88 Ry. Atomic positions were relaxed using a force conversion threshold of 1×10$^{-3}$ Ry/bohr. Only surface atoms were allowed to relax to reduce computational cost. A 4×4×1 k-point mesh was adopted for Brillouin-zone sampling. The interaction energy between the QA molecule and the perovskite surface was calculated as:

$$E_{interactions}=E_{perovskite-molecule}-E_{perovskite}-E_{molecule}$$

The invention claimed is:

1. A method of passivating a surface, the method comprising:
   providing a mixture comprising a liquid and a derivative of quinacridone, wherein the derivative of quinacridone is at least partially dissolved in the liquid;
   applying the mixture to a first surface of a film, wherein the film comprises a metal halide perovskite; and
   annealing the film for a time and a temperature effective to convert the derivative of quinacridone to quinacridone.

2. The method of claim 1, wherein the derivative of quinacridone is a compound of the following formula:

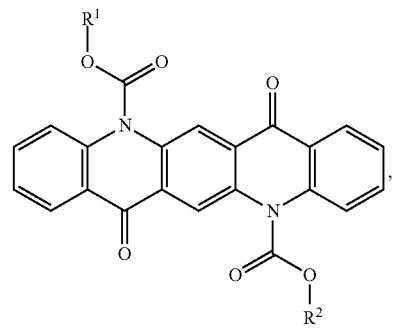

wherein R$^1$ and R$^2$ are independently selected from a C$_1$-C$_5$ hydrocarbyl.

3. The method of claim 1, wherein the derivative of quinacridone is di-tert-butyl-7,14-dioxo-7,14-dihydroquinolino[2,3-b]acridine-5,12-dicarboxylate, which has the following structure:

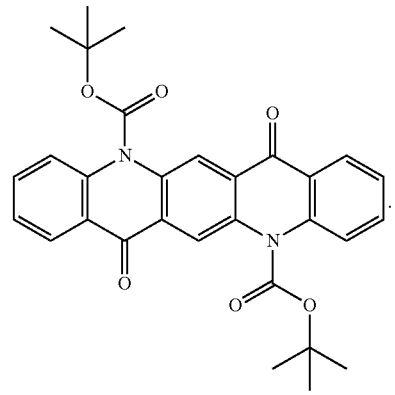 [SMILES: CC(C)(C)OC(=O)n1c2ccccc2c(=O)c2cc3c(cc21)c(=O)c1ccccc1n3C(=O)OC(C)(C)C]

4. The method of claim 1, wherein the applying of the mixture to the surface of the film comprises spin-coating the mixture to the surface of the film.

5. The method of claim 1, wherein the metal halide perovskite comprises methylammonium lead iodide ($MAPbI_3$).

6. The method of claim 1, wherein the liquid comprises isopropanol, chlorobenzene, or a combination thereof.

7. The method of claim 1, wherein a concentration of the derivative of quinacridone in the mixture is about 1.5 mg/mL to about 2.5 mg/mL.

8. The method of claim 1, wherein the time is about 10 minutes to about 20 minutes, and the temperature is about 135° C. to about 155° C.

\* \* \* \* \*